US012701878B2

(12) United States Patent
Li et al.

(10) Patent No.: US 12,701,878 B2
(45) Date of Patent: Aug. 4, 2026

(54) DISPLAY MODULE AND DISPLAY DEVICE WITH BENDING PORTION AND DEPRESSION STRUCTURE

(71) Applicants:CHENGDU BOE OPTOELECTRONICS TECHNOLOGY CO., LTD., Chengdu (CN); BOE TECHNOLOGY GROUP CO., LTD., Beijing (CN)

(72) Inventors: Fei Li, Beijing (CN); Binfeng Feng, Beijing (CN); Zhicai Xu, Beijing (CN); Jizhe Wang, Beijing (CN); Ying Zhang, Beijing (CN); Bowen Xiao, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

(*) Notice: Subject to any disclaimer, the term of this patent is extended or adjusted under 35 U.S.C. 154(b) by 461 days.

(21) Appl. No.: 18/254,610

(22) PCT Filed: Jun. 29, 2022

(86) PCT No.: PCT/CN2022/102530
§ 371 (c)(1),
(2) Date: May 26, 2023

(87) PCT Pub. No.: WO2024/000321
PCT Pub. Date: Jan. 4, 2024

(65) Prior Publication Data
US 2024/0357880 A1 Oct. 24, 2024

(51) Int. Cl.
*H10K 59/131* (2023.01)
*H10K 59/80* (2023.01)

(52) U.S. Cl.
CPC ....... *H10K 59/131* (2023.02); *H10K 59/8791* (2023.02)

(58) Field of Classification Search
CPC .......................... H10K 59/131; H10K 59/8791
See application file for complete search history.

(56) References Cited

U.S. PATENT DOCUMENTS 9,818,974 B2 * 11/2017 Kwon .................... H10K 59/40
11,626,567 B2 * 4/2023 Kim ..................... H10K 77/111
257/88
(Continued)

FOREIGN PATENT DOCUMENTS

CN 109003545 A * 12/2018 ............. G09F 9/301
CN 110716355 A * 1/2020 ......... G02F 1/13452
(Continued)

OTHER PUBLICATIONS

English translation of JP-2009294515-A (Year: 2009).*
(Continued)

*Primary Examiner* — Lex H Malsawma
(74) *Attorney, Agent, or Firm* — Dority & Manning, P.A.

(57) ABSTRACT

A display module includes a display panel, at least one driving chip, a supporting plate and a strengthening plate. The display panel includes a display portion, a bending portion and a lead-out portion. The display portion has a display surface and a non-display surface. The at least one driving chip is mounted on a side of the lead-out portion away from the display portion. The supporting plate is located on the non-display surface of the display portion. The strengthening plate is located between the supporting plate and the lead-out portion. A depression structure is provided in at least one surface of two opposite surfaces of the strengthening plate and the supporting plate; an orthographic projection of the depression structure in the at least one surface on the lead-out portion at least partially overlaps (Continued)

with an orthographic projection of the at least one driving chip on the lead-out portion.

20 Claims, 14 Drawing Sheets

(56)                References Cited

U.S. PATENT DOCUMENTS

| | | | |
|---|---|---|---|
| 2018/0081399 A1 | 3/2018 | Kwon et al. | |
| 2018/0090701 A1* | 3/2018 | Senda | H10K 77/111 |
| 2018/0197933 A1* | 7/2018 | Son | H10K 59/40 |
| 2019/0165300 A1* | 5/2019 | Lee | H10K 59/8721 |
| 2019/0393433 A1 | 12/2019 | Dagn et al. | |
| 2020/0185641 A1* | 6/2020 | Jeong | H10K 59/8791 |
| 2021/0368658 A1 | 11/2021 | Tang | |
| 2022/0110226 A1 | 4/2022 | Zhang et al. | |
| 2022/0166082 A1 | 5/2022 | Wang et al. | |
| 2023/0058372 A1 | 2/2023 | Li et al. | |

FOREIGN PATENT DOCUMENTS

| | | | | | |
|---|---|---|---|---|---|
| CN | 110782801 A | * | 2/2020 | | G09F 9/30 |
| CN | 213716385 U | | 7/2021 | | |
| CN | 113539096 A | | 10/2021 | | |
| CN | 114005363 A | * | 2/2022 | | G09F 9/301 |
| CN | 114550589 A | | 5/2022 | | |
| CN | 114613269 A | | 6/2022 | | |
| CN | 115019636 A | | 9/2022 | | |
| JP | 2009294515 A | * | 12/2009 | | |

OTHER PUBLICATIONS

English translation of CN-109003545-A (Year: 2018).*
English translation of CN-110716355-A (Year: 2020).*
English translation of CN-110782801-A (Year: 2020).*
English translation of CN-114005363-A (Year: 2022).*

* cited by examiner

200

100

200A

100

DISPLAY MODULE AND DISPLAY DEVICE WITH BENDING PORTION AND DEPRESSION STRUCTURE

CROSS-REFERENCE TO RELATED APPLICATION

This application is a national phase entry under 35 USC 371 of International Patent Application No. PCT/CN2022/102530 filed on Jun. 29, 2022, which is incorporated herein by reference in its entirety.

TECHNICAL FIELD

The present disclosure relates to the field of display technologies, and in particular, to a display module and a display device.

BACKGROUND

With the development of display technologies, screen-to-body ratios of various display devices are increasing, and products such as full screens and folding screens are also produced in order to achieve the extreme size of the display screen. The organic light-emitting diode (OLED) display device is one of the hot spots in the current display technology field, and is more and more widely used due to its advantages such as no need for a backlight, high contrast, small thickness, wide viewing angle, fast response speed, applicability to a flexible panel, and simple structure and manufacturing process.

SUMMARY

In an aspect, a display module is provided. The display module includes a display panel, at least one driving chip, a supporting plate and a strengthening plate. The display panel includes a display portion, a bending portion and a lead-out portion. The bending portion is connected to the display portion and the lead-out portion. The display portion has a display surface and a non-display surface, and the non-display surface is a surface opposite to the display surface. The lead-out portion is located at the non-display surface of the display portion. The at least one driving chip is mounted on a side of the lead-out portion away from the display portion. The supporting plate is located on the non-display surface of the display portion. The strengthening plate is located between the supporting plate and the lead-out portion. A depression structure is provided in at least one surface of two opposite surfaces of the strengthening plate and the supporting plate; an orthographic projection, on the lead-out portion, of the depression structure in the at least one surface at least partially overlaps with an orthographic projection of the at least one driving chip on the lead-out portion.

In some embodiments, the at least one driving chip includes two or more driving chips. The orthographic projection, on the lead-out portion, of the depression structure in the at least one surface at least partially overlaps with an orthographic projection of each driving chip on the lead-out portion.

In some embodiments, the depression structure includes a first depression structure that is disposed in a surface of the strengthening plate proximate to the supporting plate. The first depression structure includes a plurality of first grooves, and the plurality of first grooves extend in a first direction and are arranged at intervals in a second direction. The first direction and the second direction intersect and are both parallel to the strengthening plate.

In some embodiments, the depression structure includes a first depression structure that is disposed in a surface of the strengthening plate proximate to the supporting plate. The first depression structure includes a plurality of first grooves, and the plurality of first grooves extend in a second direction and are arranged at intervals in the second direction. A number of the plurality of first grooves in the first depression structure is greater than or equal to a number of the at least one driving chip. An orthographic projection of each driving chip on the lead-out portion at least partially overlaps with an orthographic projection of at least one first groove in the plurality of first grooves on the lead-out portion.

In some embodiments, the plurality of first grooves are also arranged at intervals in a first direction. The first direction and the second direction intersect and are both parallel to the strengthening plate.

In some embodiments, at least one of the plurality of first grooves penetrates through at least one side surface of two opposite side surfaces of the strengthening plate in the first direction.

In some embodiments, the depression structure includes a second depression structure that is disposed in the strengthening plate, and the second depression structure includes a plurality of first holes arranged at intervals. A first hole in the plurality of first holes extends in a thickness direction of the strengthening plate and penetrates at least through a surface of the strengthening plate proximate to the supporting plate.

In some embodiments, the first hole further penetrates through a surface of the strengthening plate away from the supporting plate.

In some embodiments, the depression structure includes a third depression structure that is disposed in a surface of the supporting plate proximate to the strengthening plate, and the third depression structure includes a plurality of second grooves. The plurality of second grooves extend in a third direction and are arranged at intervals in a fourth direction. The third direction and the fourth direction intersect and are both parallel to the supporting plate.

In some embodiments, at least one end of at least one of the plurality of second grooves in the third direction exceeds an edge of the strengthening plate.

In some embodiments, at least one of the plurality of second grooves penetrates through at least one side surface of two opposite side surfaces of the supporting plate in the third direction.

In some embodiments, in the case where the depression structure includes the first depression structure that is disposed in the surface of the strengthening plate proximate to the supporting plate, and the first depression structure includes the plurality of first grooves, an extending direction of the plurality of second grooves intersects an extending direction of the plurality of first grooves.

In some embodiments, the plurality of second grooves extend in a direction parallel to a bending axis of the bending portion, and the plurality of first grooves extend in a direction perpendicular to the bending axis.

In some embodiments, the depression structure includes a fourth depression structure that is disposed in the supporting plate, and the fourth depression structure includes a plurality of second holes arranged at intervals. A second hole in the plurality of second holes extends in a thickness direction of the supporting plate and penetrates at least through a surface of the supporting plate proximate to the strengthening plate.

In some embodiments, the second hole further penetrates through a surface of supporting plate away from strengthening plate.

In some embodiments, in the case where the depression structure includes the second depression structure that is disposed in the surface of the strengthening plate proximate to the supporting plate, and the second depression structure includes the plurality of first holes, the plurality of second holes are arranged in a plurality of rows, and the plurality of first holes are arranged in a plurality of rows. In a column direction, a row of first holes is arranged alternately with a row of second holes, and first holes in a row and second holes in an adjacent row are staggered.

In some embodiments, an area of an overlapping region between an orthographic projection of the strengthening plate on the display portion and an orthographic projection of the supporting plate on the display portion is greater than or equal to ¼ of an area of the orthographic projection of the supporting plate on the display portion.

In some embodiments, the display module further includes a first adhesive layer. The first adhesive layer is located between the supporting plate and the strengthening plate. The first adhesive layer includes a hollowed-out region, and the orthographic projection of the at least one driving chip on the first adhesive layer is located at the hollowed-out region.

In some embodiments, the display module further includes a second adhesive layer and a third adhesive layer. The second adhesive layer is located between the supporting plate and the display portion. The third adhesive layer is located between the strengthening plate and the lead-out portion of the display panel.

In some embodiments, the display module further includes a flexible circuit board and a fourth adhesive layer. The flexible circuit board is located on a side of the strengthening plate away from the display portion. The flexible circuit board is bonded to an edge of the lead-out portion away from the bending portion. The fourth adhesive layer is located between the flexible circuit board and the strengthening plate.

In some embodiments, the display module further includes a polarizer, a cover plate and a fifth adhesive layer. The polarizer is disposed on the display surface of the display portion of the display panel. The cover plate is located on a side of the polarizer away from the display portion. The fifth adhesive layer is located between the polarizer and the cover plate.

In another aspect, a display device is provided. The display device includes the display module according to any of the embodiments described above.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on actual sizes of products involved in the embodiments of the present disclosure.

4

Figure 1A:
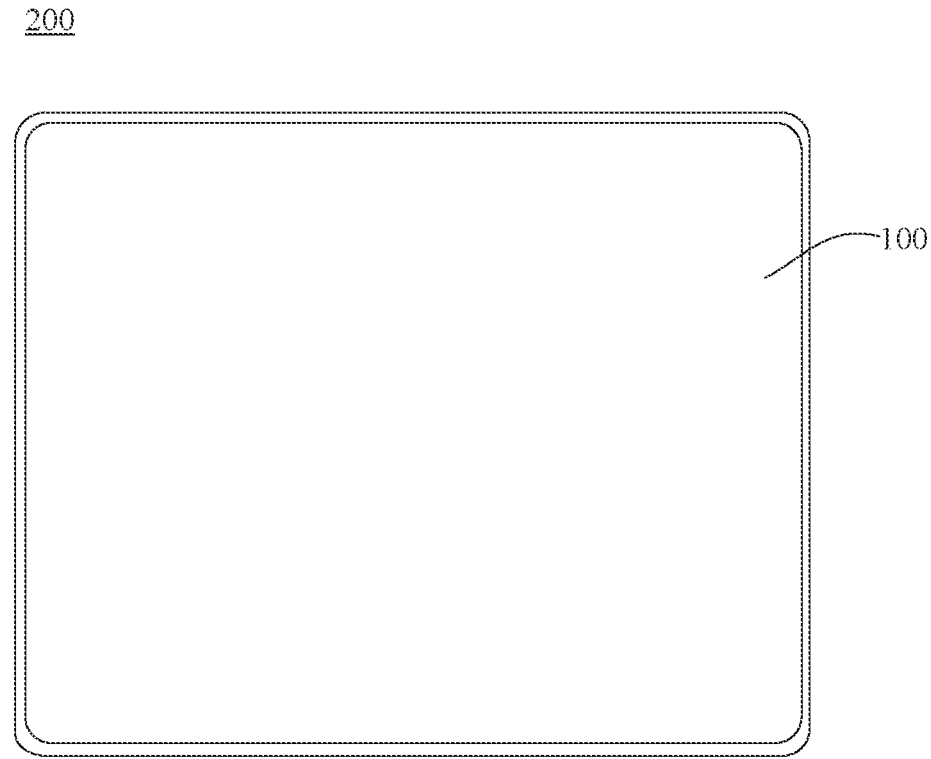
FIG. 1A is a schematic diagram of a display device, in accordance with some embodiments.
Figure 1B:
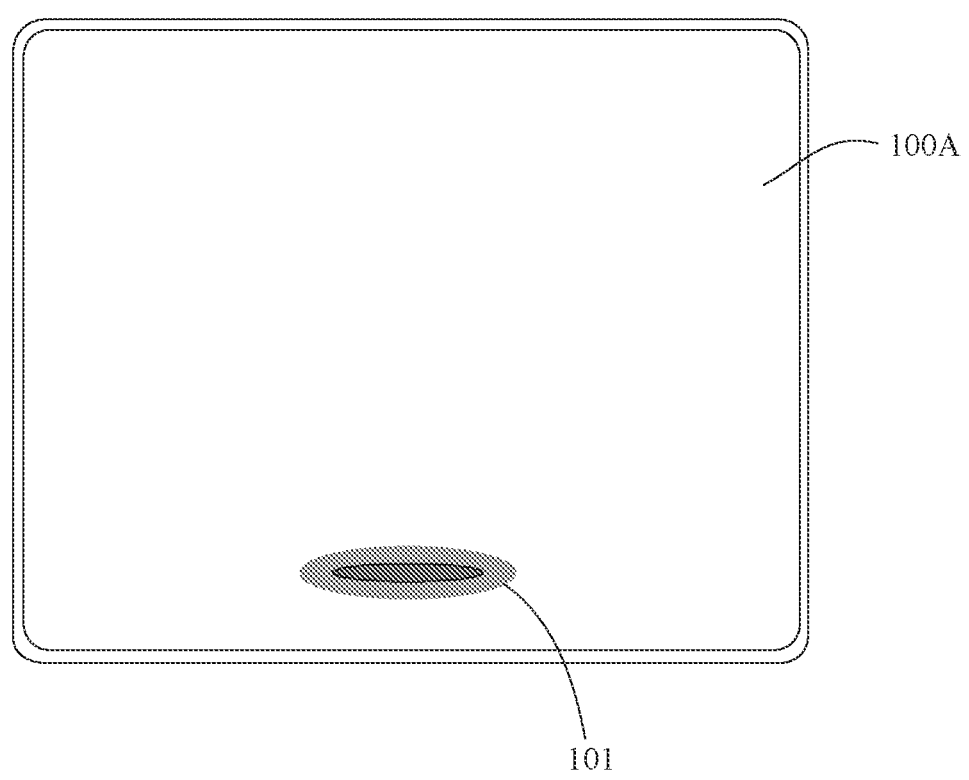
Figure 2:
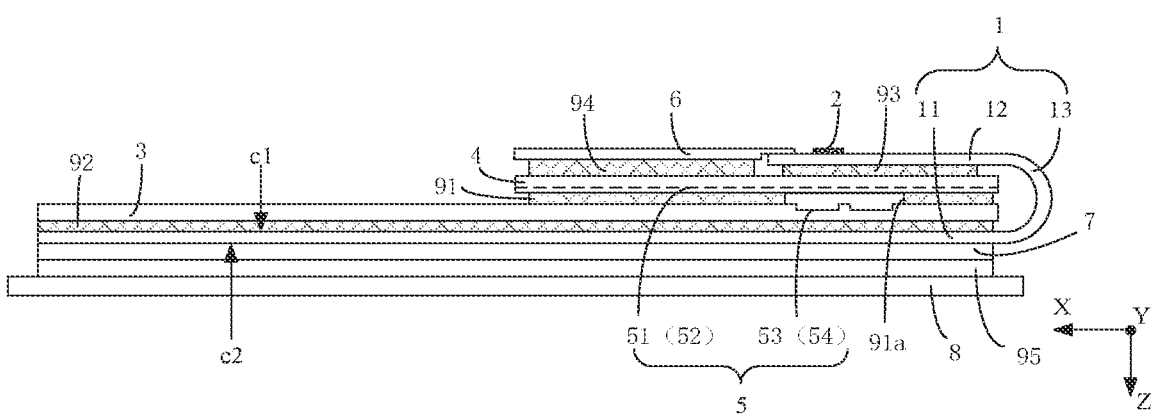
Figure 3A:
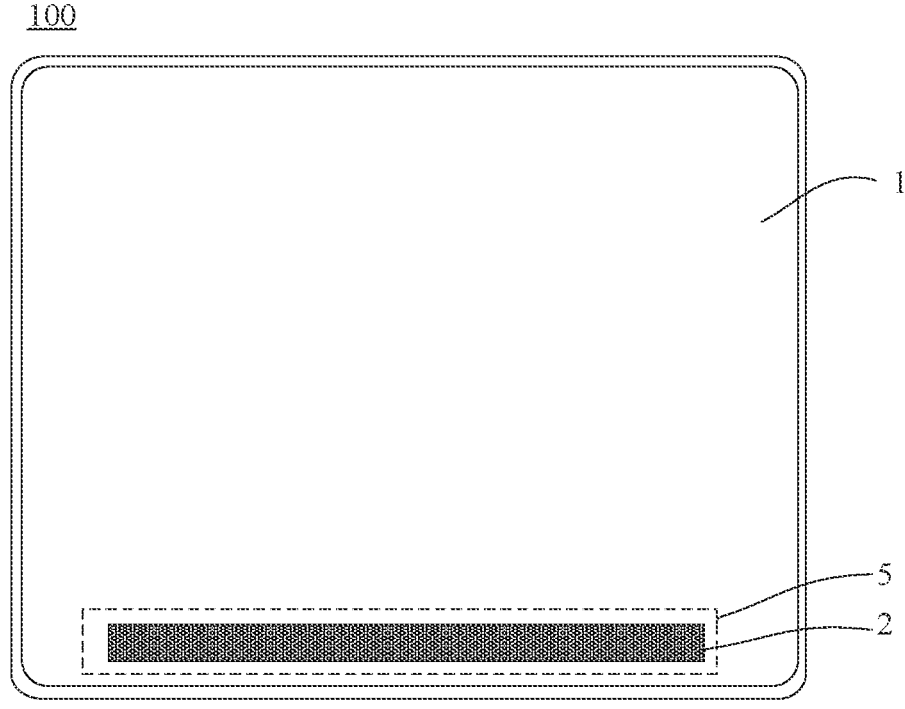
Figure 3B:
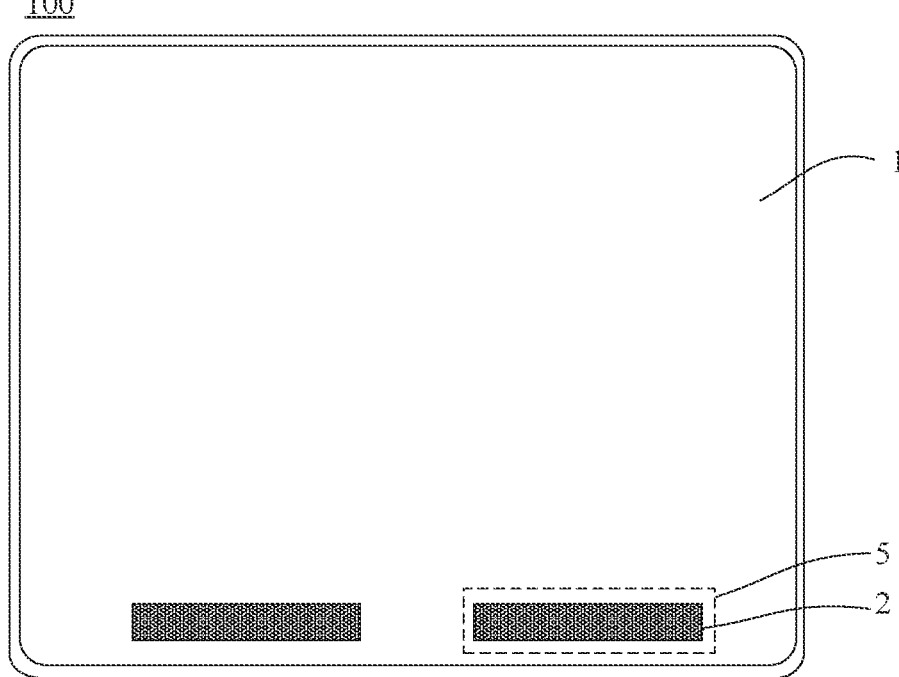
Figure 3C:
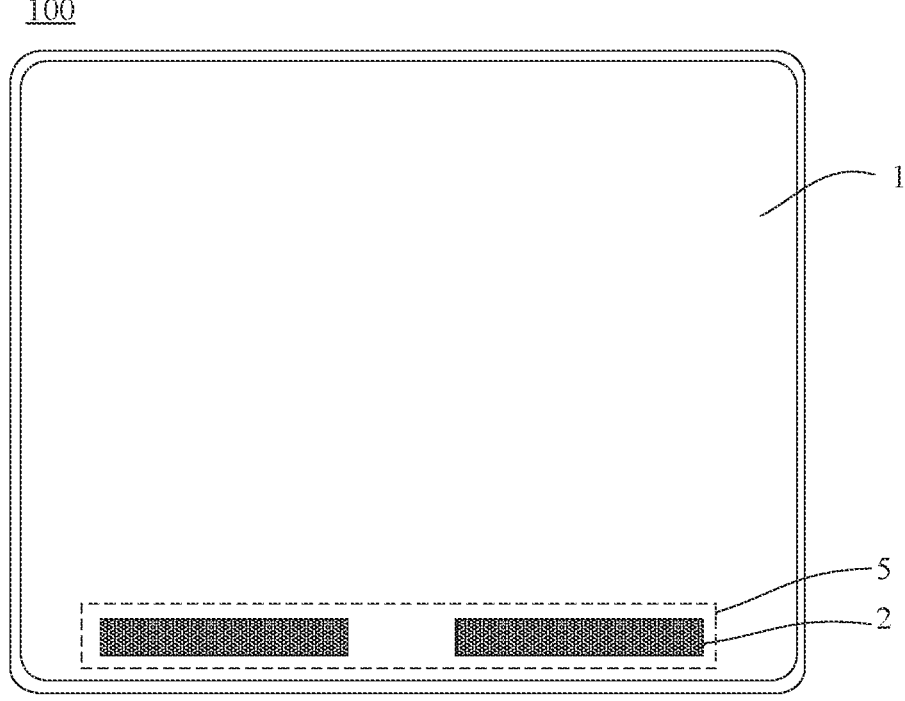
Figure 4:
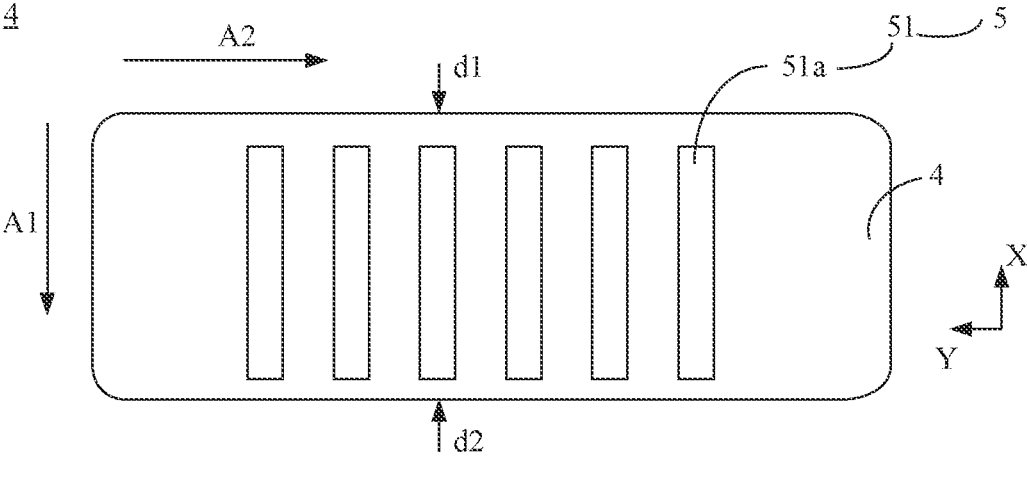
Figure 5:
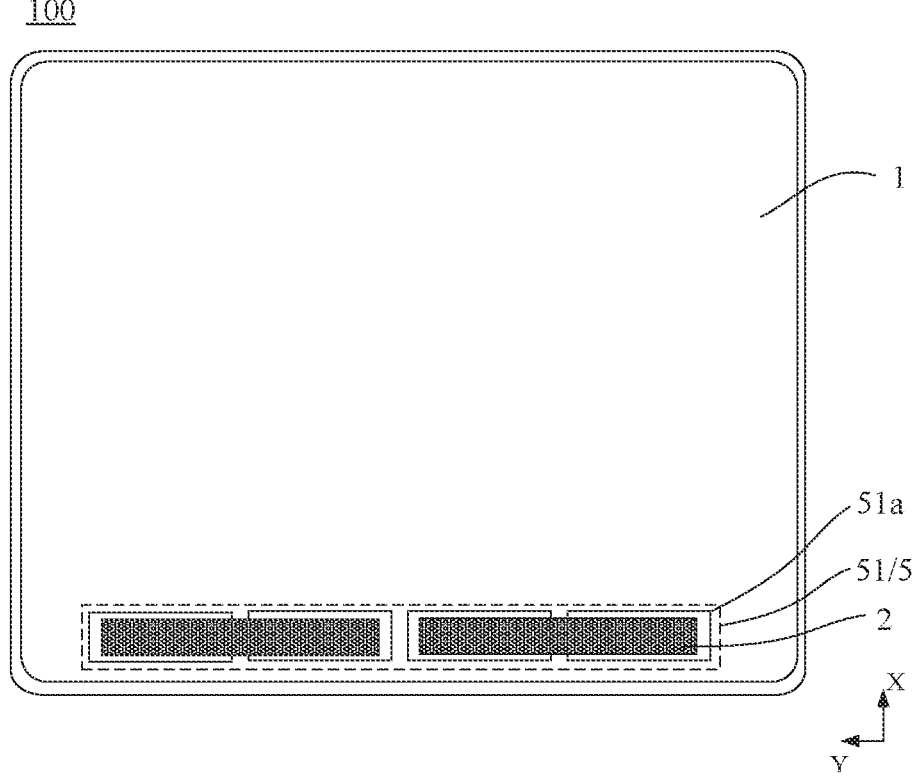
Figure 6:
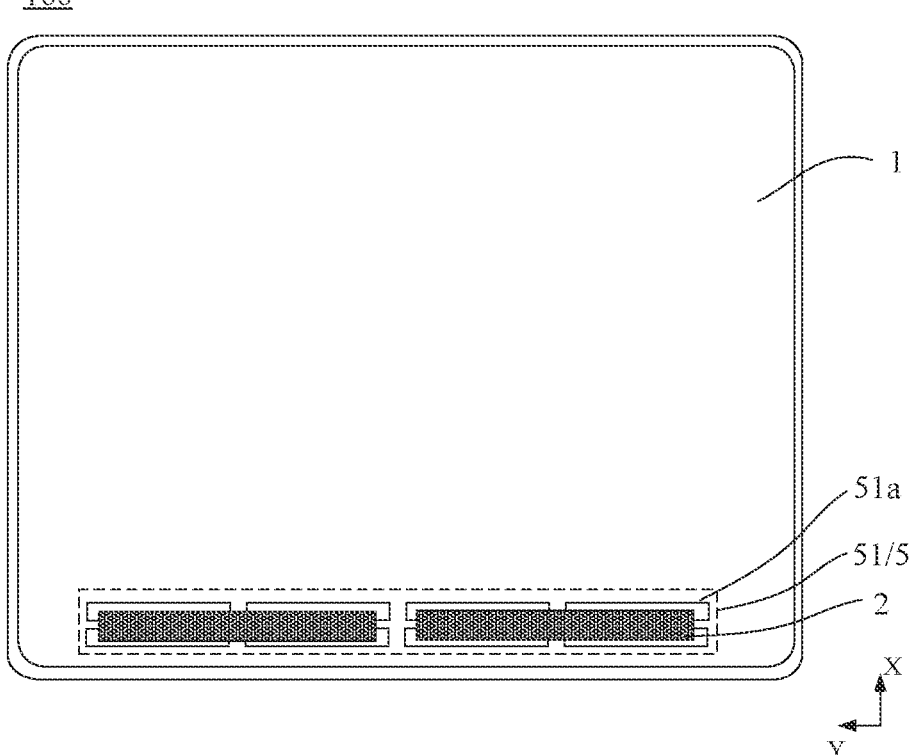
Figure 7:
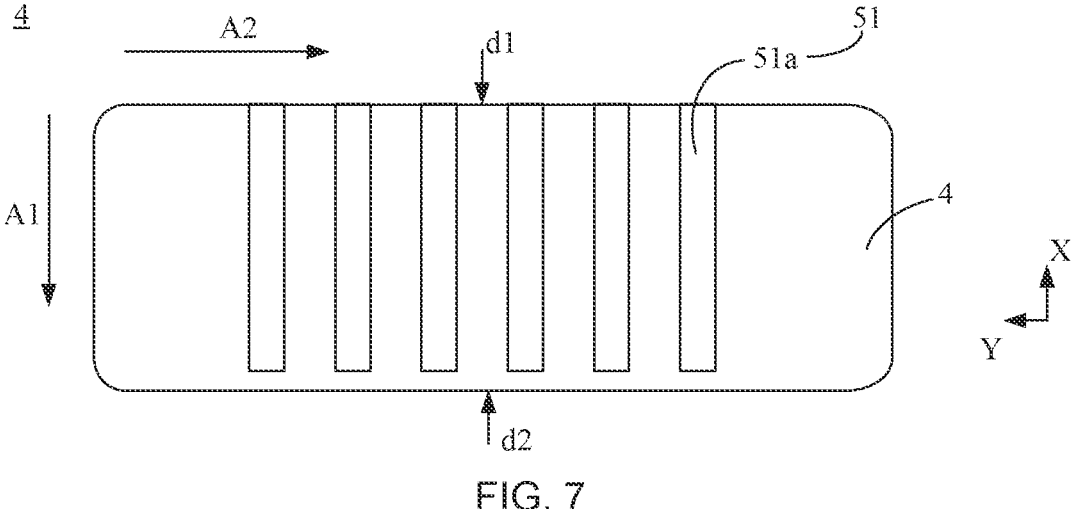
Figure 8:
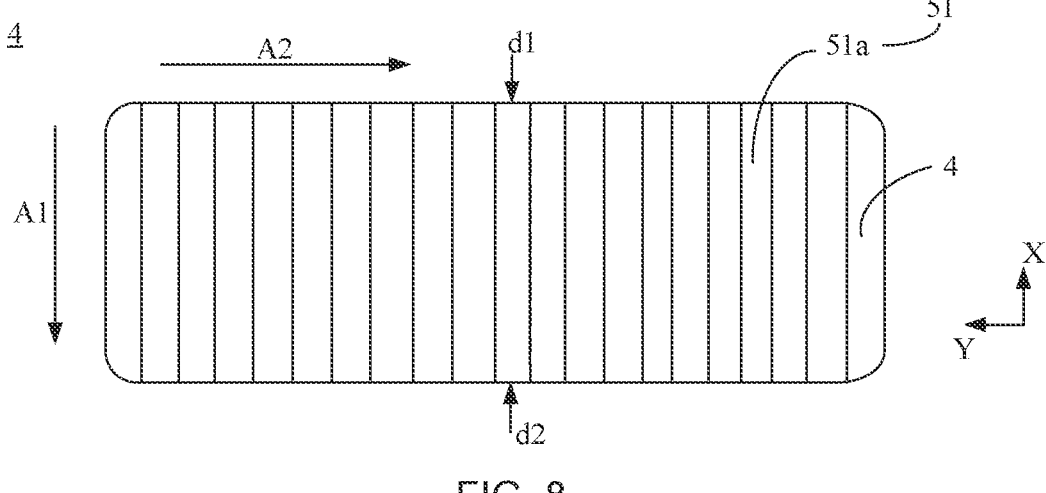
Figure 9:
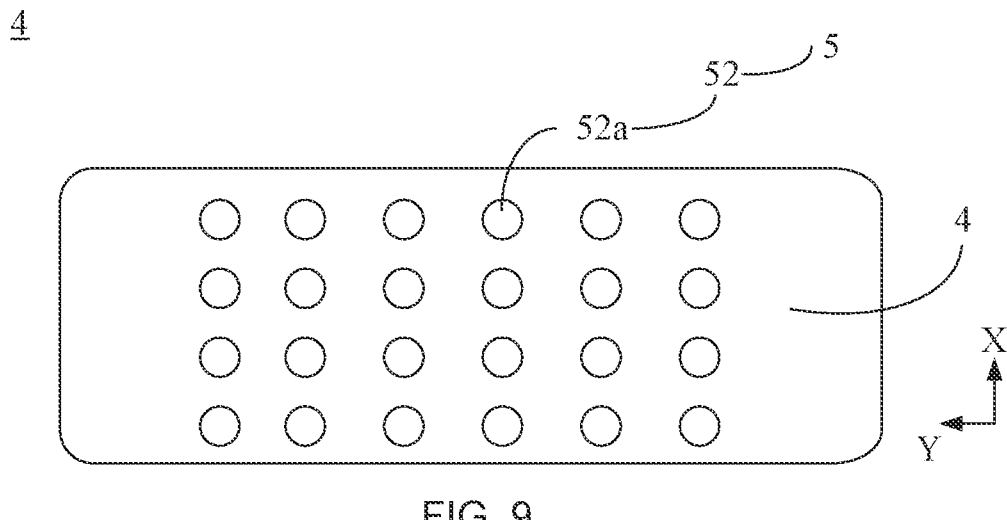
Figure 10:
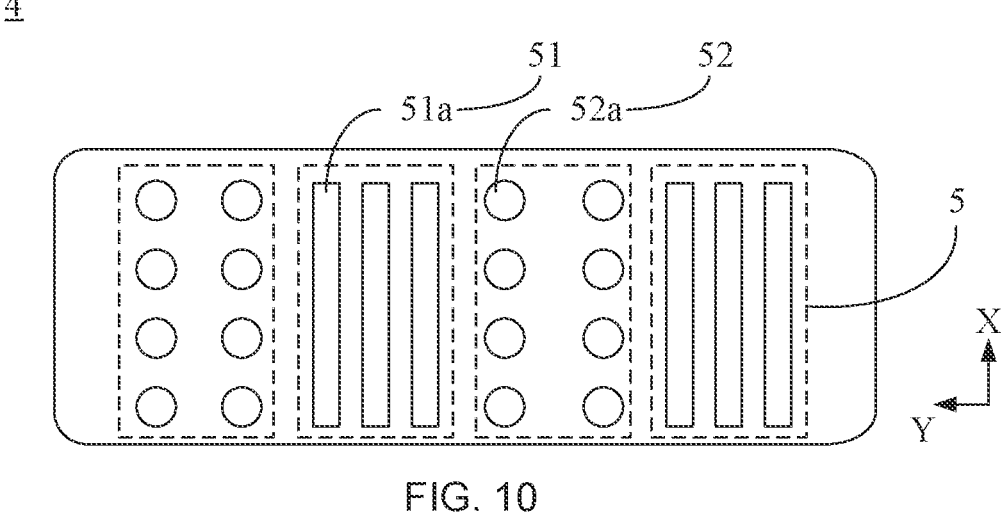
Figure 11:
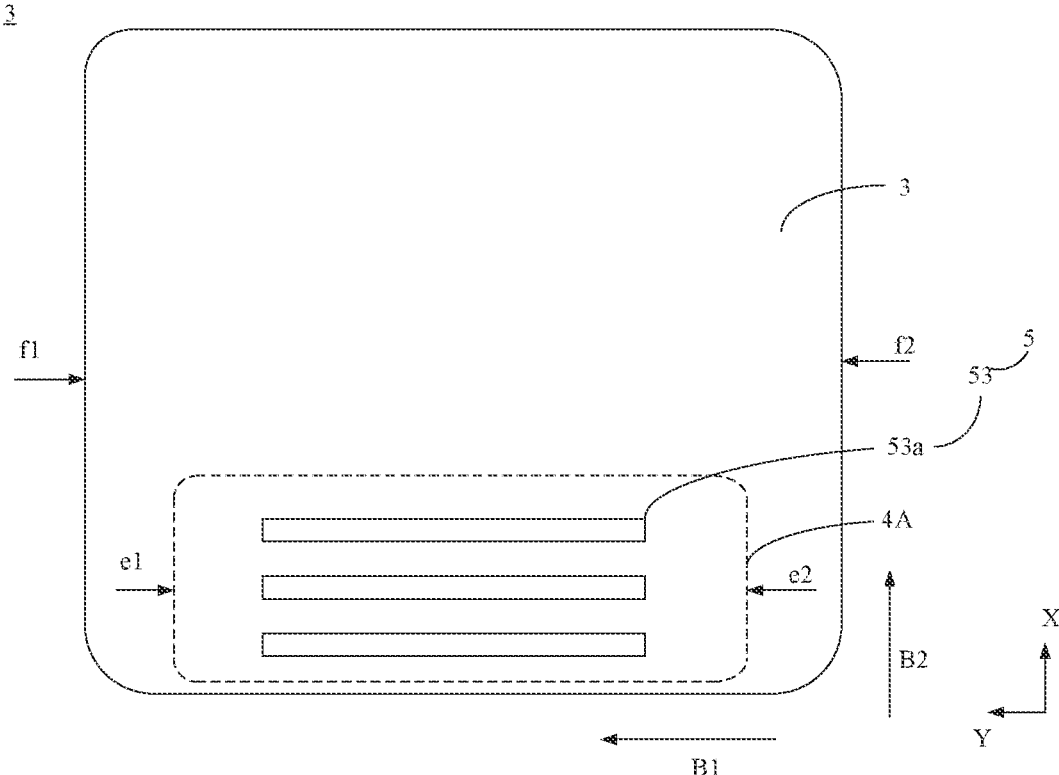
Figure 12:
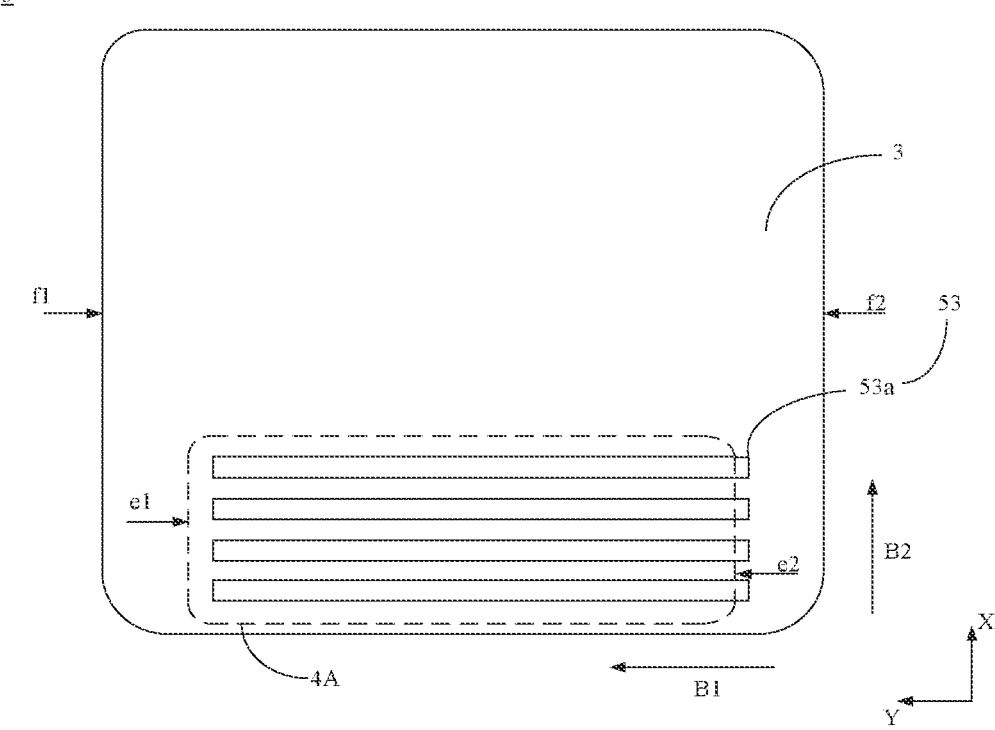
Figure 13:
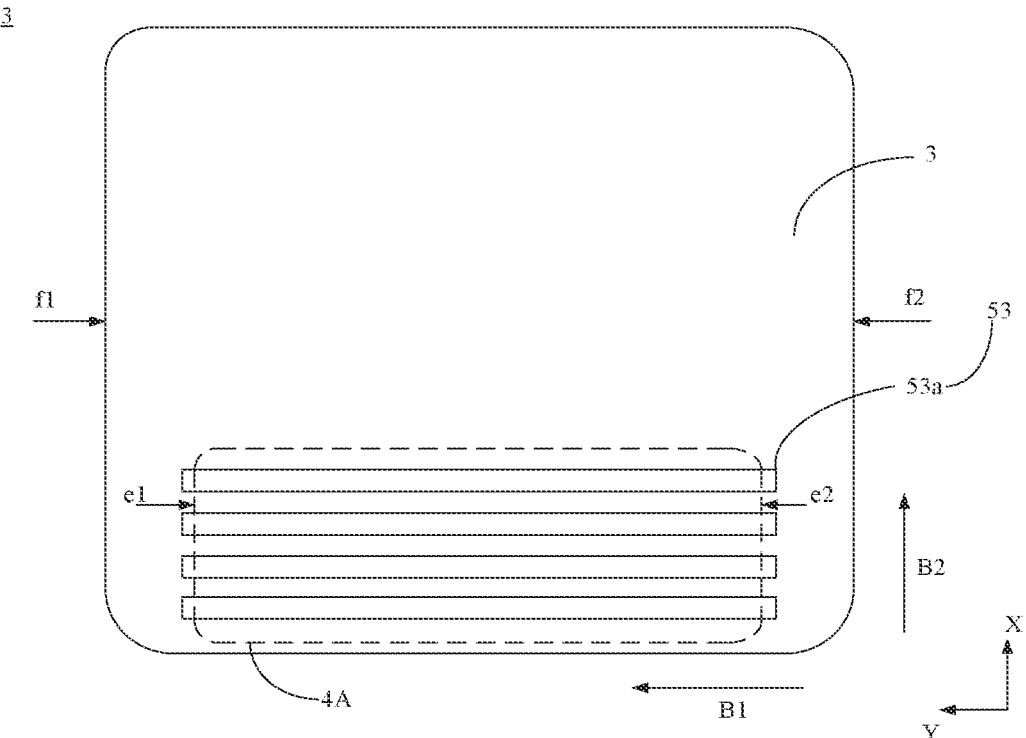
Figure 14:
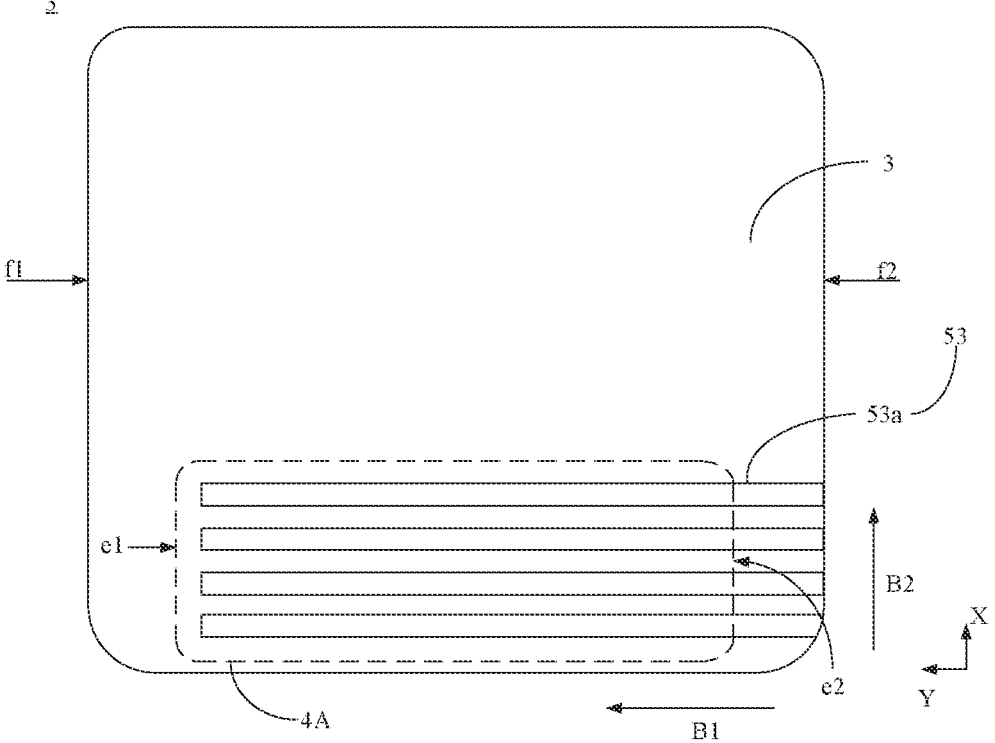
Figure 15:
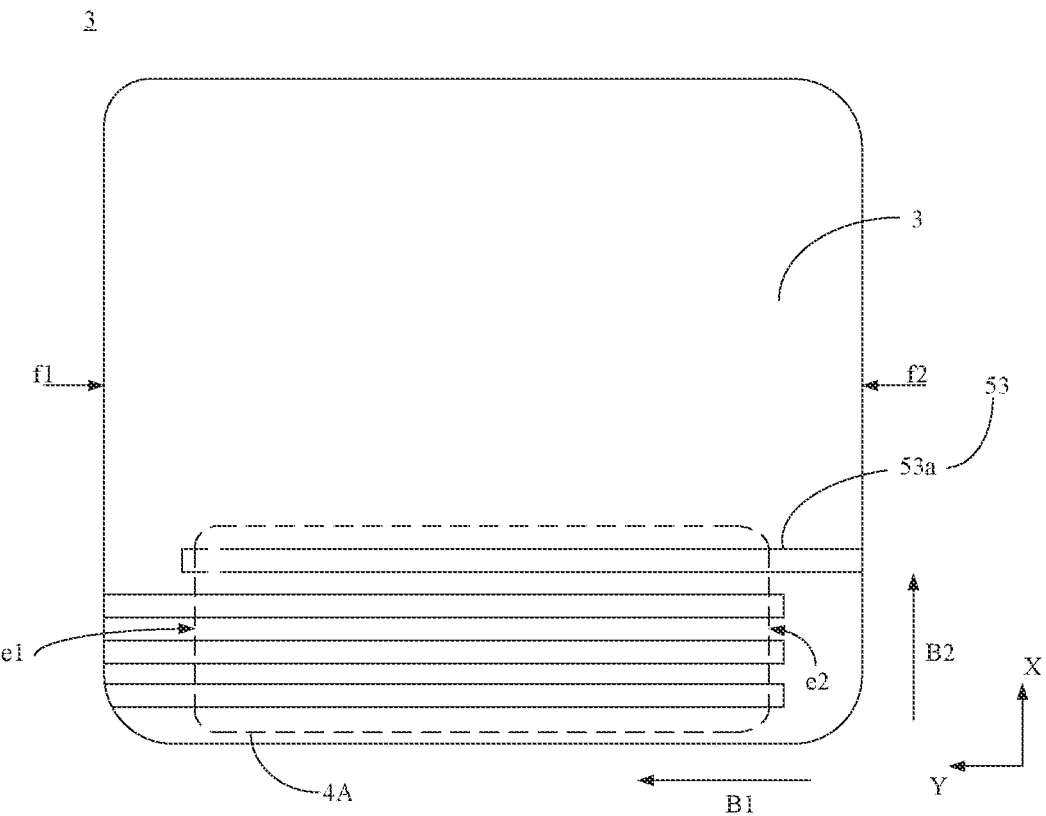
Figure 16:
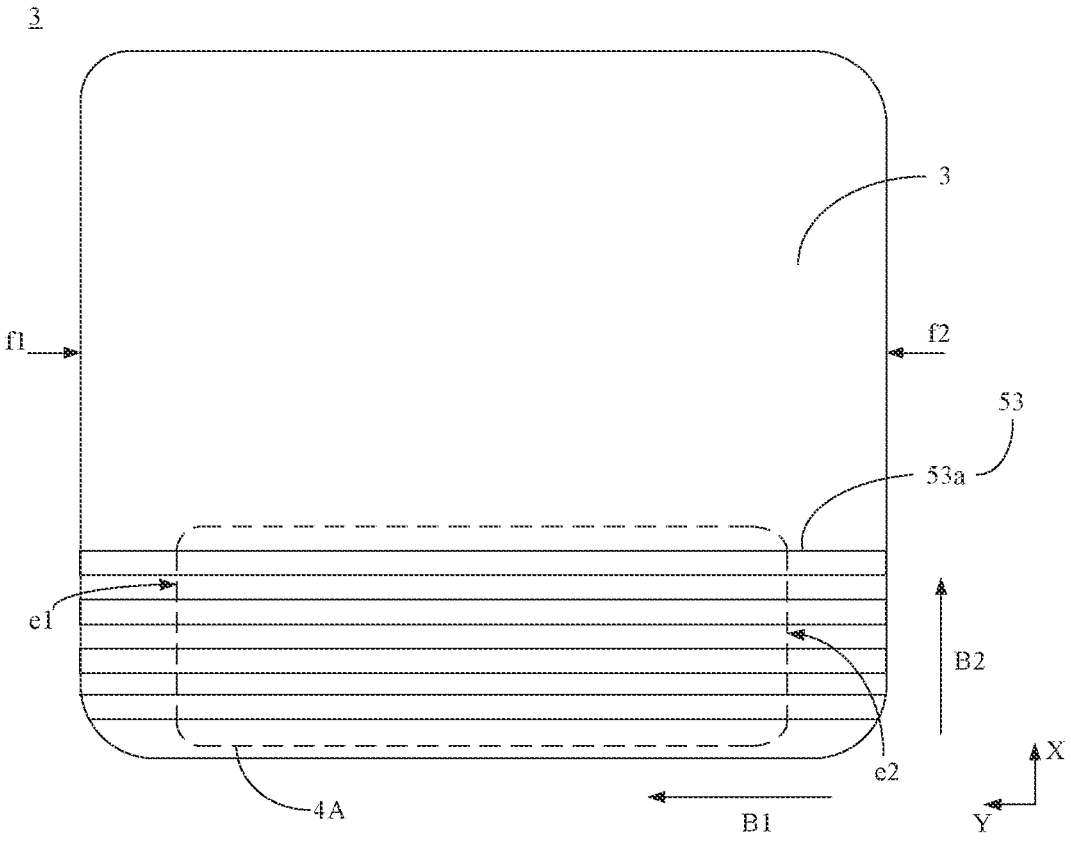
Figure 17:
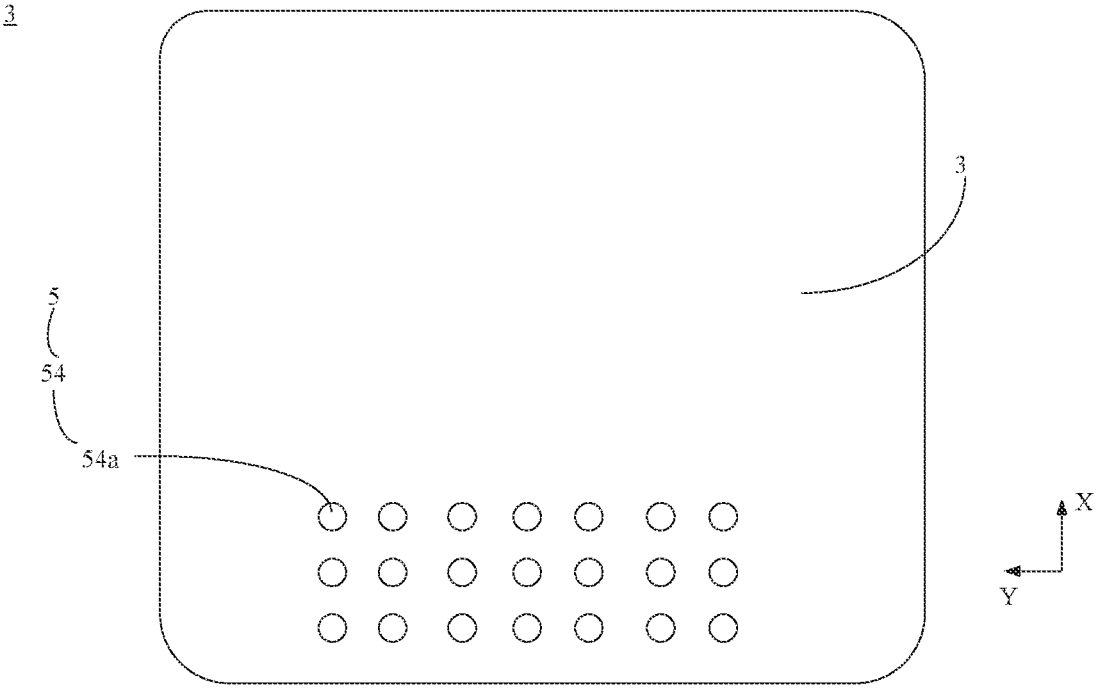
Figure 18:
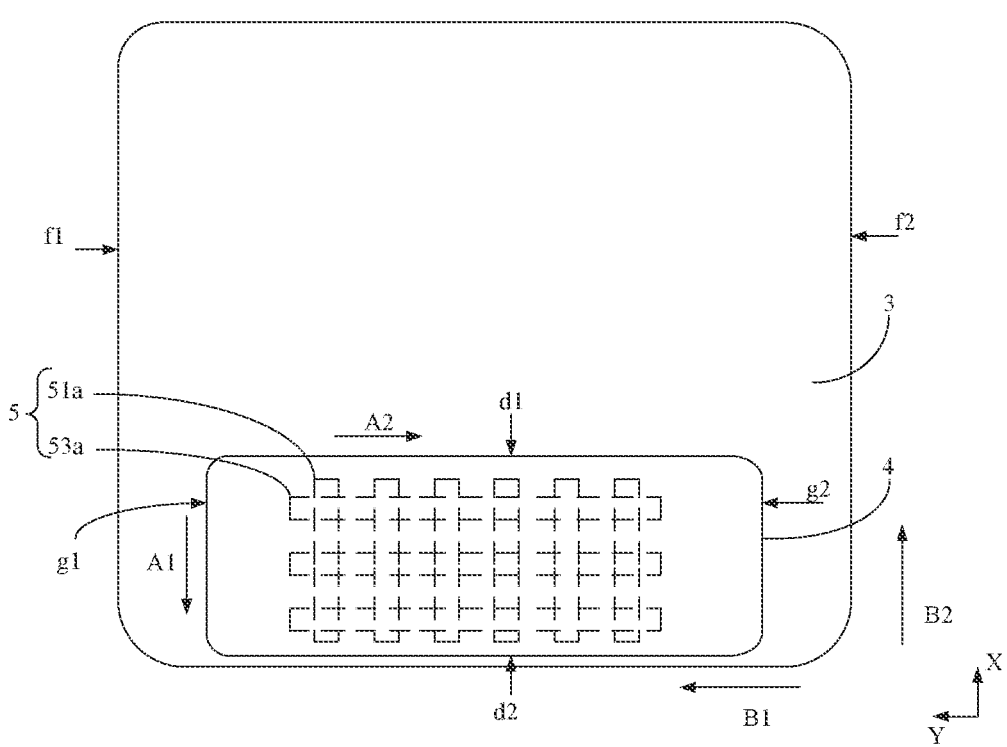
Figure 19:
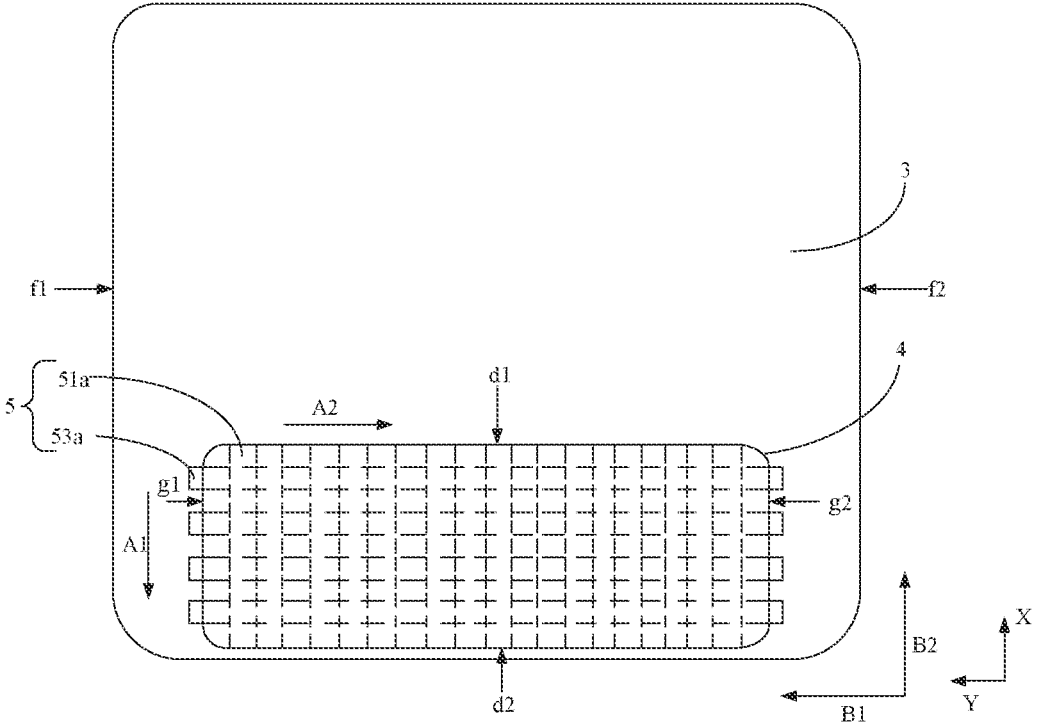
Figure 20:
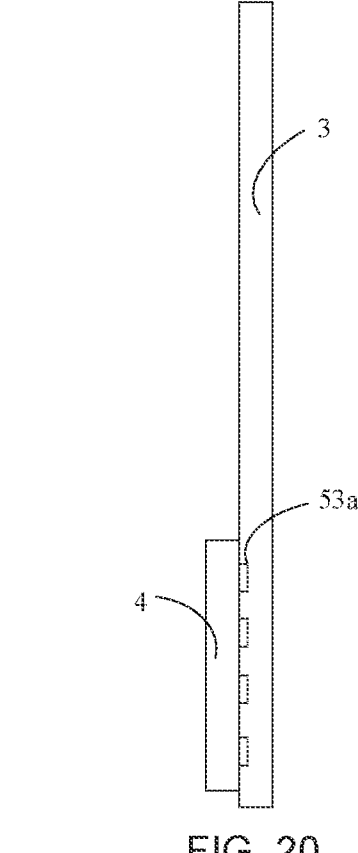
Figure 21:
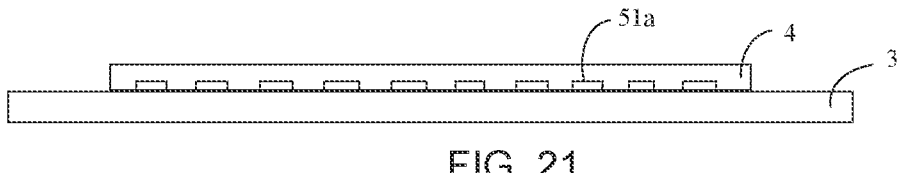
Figures 22, 23:
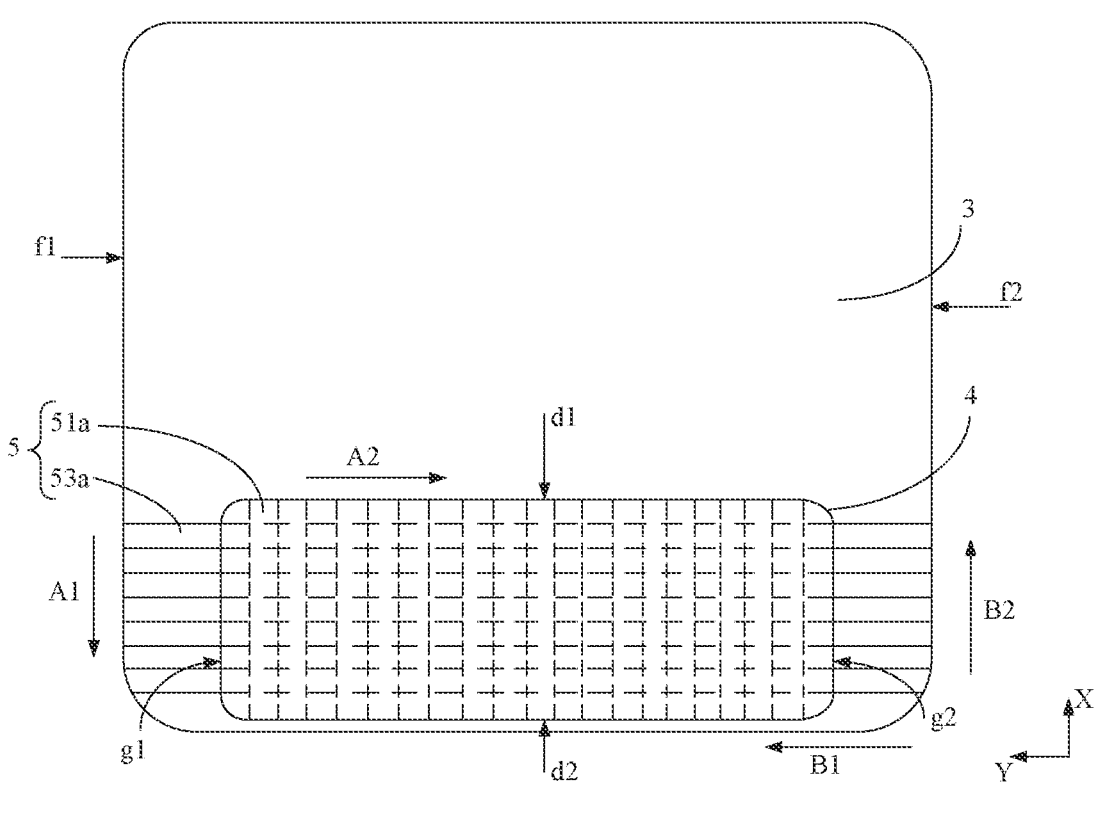

FIG. 1B is a schematic diagram of another display device with a display region being burned, in accordance with some embodiments;

FIG. 2 is a structural diagram of a display module, in accordance with some embodiments;

FIG. 3A is a schematic diagram of a display module, in accordance with some embodiments;

FIG. 3B is a schematic diagram of another display module, in accordance with some embodiments;

FIG. 3C is a schematic diagram of yet another display module, in accordance with some embodiments;

FIG. 4 is a structural diagram of a strengthening plate, in accordance with some embodiments;

FIG. 5 is a structural diagram of another display module, in accordance with some embodiments;

FIG. 6 is a structural diagram of yet another display module, in accordance with some embodiments;

FIG. 7 is a structural diagram of another strengthening plate, in accordance with some embodiments;

FIG. 8 is a structural diagram of yet another strengthening plate, in accordance with some embodiments;

FIG. 9 is a structural diagram of yet another strengthening plate, in accordance with some embodiments;

FIG. 10 is a structural diagram of yet another strengthening plate, in accordance with some embodiments;

FIG. 11 is a structural diagram of a supporting plate, in accordance with some embodiments;

FIG. 12 is a structural diagram of another supporting plate, in accordance with some embodiments;

FIG. 13 is a structural diagram of yet another supporting plate, in accordance with some embodiments;

FIG. 14 is a structural diagram of yet another supporting plate, in accordance with some embodiments;

FIG. 15 is a structural diagram of yet another supporting plate, in accordance with some embodiments;

FIG. 16 is a structural diagram of yet another supporting plate, in accordance with some embodiments;

FIG. 17 is a structural diagram of yet another supporting plate, in accordance with some embodiments;

FIG. 18 is a top view of a combination of a supporting plate and a strengthening plate, in accordance with some embodiments;

FIG. 19 is a top view of another combination of a supporting plate and a strengthening plate, in accordance with some embodiments;

FIG. 20 is a right side view of the combination of the supporting plate and the strengthening plate in FIG. 19;

FIG. 21 is a front view of the combination of the supporting plate and the strengthening plate in FIG. 19;

FIG. 22 is a top view of yet another combination of a supporting plate and a strengthening plate, in accordance with some embodiments; and FIG. 23 is a top view of yet another combination of a supporting plate and a strengthening plate, in accordance with some embodiments.

DETAILED DESCRIPTION

Technical solutions in some embodiments of the present disclosure will be described clearly and completely with reference to the accompanying drawings below. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, the term "comprise" and other forms thereof such as the third-person singular form "comprises" and the present participle form "comprising" throughout the specification and the claims are construed as an open and inclusive meaning, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

The terms "first" and "second" are used for descriptive purposes only, and are not to be construed as indicating or implying a relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

In addition, the phrase "based on" used herein is meant to be open and inclusive, since a process, step, calculation or other action that is "based on" one or more of the stated conditions or values may, in practice, be based on additional conditions or values exceeding those stated.

The terms "parallel" and "perpendicular" as used herein include the stated conditions and the conditions similar to the stated conditions, and the range of the similar conditions is within the acceptable range of deviation, where the acceptable range of deviation is determined by a person of ordinary skill in the art in consideration of the measurement in question and the error associated with the measurement of a specific quantity (i.e., the limitation of the measurement system). For example, the term "parallel" includes absolute parallelism and approximate parallelism, and an acceptable range of deviation of the approximate parallelism may be, for example, a deviation within 5°; the term "perpendicular" includes absolute perpendicularity and approximate perpendicularity, and an acceptable range of deviation of the approximate perpendicularity may also be, for example, a deviation within 5°.

Exemplary embodiments are described herein with reference to section views and/or plan views as idealized exemplary drawings. In the accompanying drawings, thicknesses of layers and sizes of regions are enlarged for clarity. Variations in shapes with respect to the accompanying drawings due to, for example, manufacturing technologies and/or tolerances may be envisaged. Therefore, the exemplary embodiments should not be construed as being limited to the shapes of the regions shown herein, but including deviations due to, for example, manufacturing. For example, an etched region shown as a rectangular shape generally has a curved feature. Therefore, the regions shown in the accompanying drawings are schematic in nature, and their shapes are not intended to show actual shapes of regions in devices, and are not intended to limit the scope of the exemplary embodiments.

FIG. 1A is a schematic diagram of a display device, in accordance with some embodiments; and FIG. 2 is a structural diagram of a display module, in accordance with some embodiments.

Some embodiments of the present disclosure provide a display device 200. Referring to FIG. 1A, the display device 200 includes a display module 100. As shown in FIG. 2, the display module 100 includes a flexible display panel 1 and a driving chip 2. The driving chip 2 is used to drive the flexible display panel 1 to perform display.

For example, the flexible display panel 1 may be an electroluminescent display panel or a photoluminescent display panel. In a case where the flexible display panel 1 is the electroluminescent display panel, the electroluminescent display panel may be an organic light-emitting diode (OLED) display panel or a quantum dot light-emitting diode (QLED) display panel. In a case where the flexible display panel 1 is the photoluminescent display panel, the photoluminescent display panel may be a quantum dot photoluminescent display panel.

It can be understood that the display device 200 may be any device that displays images whether in motion (e.g., videos) or stationary (e.g., static images), and whether textual or graphical.

It will be noted that, it is contemplated that the display device 200 may be implemented in or associated with a variety of electronic devices. The variety of electronic devices include (but not limit to), for example, mobile telephones, wireless devices, personal digital assistants (PDAs), hand-held or portable computers, global positioning system (GPS) receivers/navigators, cameras, moving picture experts group (MP4) video players, video cameras, game consoles, watches, clocks, calculators, TV monitors, computer monitors, car displays (e.g., odometer displays), navigators, cockpit controllers and/or displays, camera view displays (e.g., rear view camera displays in a vehicle), electronic photos, electronic billboards or signage, projectors, building structures, packaging and aesthetic structures (e.g., displays for images of a piece of jewelry).

FIG. 1B is a schematic diagram of another display device with a display region being burned, in accordance with some embodiments. In some implementations, referring to FIG. 1B, the display device 200A includes a display module 100A, and the display module 100A includes a flexible display panel and a driving chip. In a display state, the driving chip of the display module 100A generates heat. Under the influence of temperature, in the display region 101 of the flexible display panel corresponding to the driving chip, blue sub-pixels are faster in service life attenuation and lower in luminous efficiency relative to the sub-pixels of other colors, and thus, the brightness of the blue sub-pixels is reduced. This results in a color cast in the display of the display region 101, the display effect changes from normal to yellowish, even burns are caused, and in severe cases, the whole flexible display panel can be even disabled.

Based on this, some embodiments of the present disclosure provide a display module 100. Referring to FIG. 2, the display module 100 includes a flexible display panel 1, at least one driving chip 2, a supporting plate 3 and a strengthening plate 4. It can be understood that the display module 100 can be applied to any of the display devices.

As shown in FIG. 2, the flexible display panel 1 includes a display portion 11, a lead-out portion 12, and a bending portion 13. The bending portion 13 is connected to the display portion 11 and the lead-out portion 12. The display portion 11 has a display surface c2 and a non-display surface c1, the display surface c2 is used for displaying images, and the non-display surface c1 is a surface opposite to the display surface c2. The lead-out portion 12 is located at a side of the non-display surface c1 of the display portion 11.

The driving chip 2 is mounted on a side of the lead-out portion 12 away from the display portion 11, and is used to drive the display portion 11 of the flexible display panel 1 to perform display.

The supporting plate 3 is located on a side of the non-display surface c1 of the display portion 11, and is used to support the display portion 11 of the flexible display panel 1.

For example, a material of the supporting plate 3 includes stainless steel (SUS), titanium alloy, or the like. Of course, other material with a support function may also be chosen for the supporting plate 3, which is not limited here.

The strengthening plate 4 is located between the supporting plate 3 and the lead-out portion 12, and is used to support the lead-out portion 12 of the flexible display panel 1.

For example, a material of the strengthening plate 4 includes aluminum alloy, copper, stainless steel, silver, titanium alloy, or the like. Of course, other material with a strengthening support function may also be chosen for the strengthening plate 4, which is not limited here.

It will be noted that, when the display module 100 is in a display state, heat generated by the driving chip 2 can be transmitted to a region of the display portion 11 corresponding to the driving chip 2 in the Z direction, and can also be diffused on the strengthening plate 4 and the supporting plate 3 in the X direction and the Y direction. Since an actual contact area between the supporting plate 3 and the strengthening plate 4 is large, and a dimension of the display module 100 in the Z direction is small, the heat generated by the driving chip 2 has a high transmission efficiency in the Z direction. It is easy to reduce the brightness of sub-pixels (especially the blue sub-pixels) in the region of the display portion 11 corresponding to the driving chip 2 due to the temperature influence, resulting in color cast and even yellowing of the display in this region.

With continued reference to FIG. 2, in the display module 100 provided in some embodiments of the present disclosure, a depression structure 5 is provided in at least one surface of two opposite surfaces of the strengthening plate 4 and the supporting plate 3. An orthographic projection, on the lead-out portion 12, of the depression structure 5 in the at least one surface at least partially overlaps with an orthographic projection of the at least one driving chip 2 on the lead-out portion 12.

It can be understood that, in some examples, the depression structure 5 is disposed in a surface of the strengthening plate 4 facing the supporting plate 3. In other examples, the depression structure 5 is provided in a surface of the supporting plate 3 facing the strengthening plate 4. In yet other examples, the depression structure 5 may be disposed in the two opposite surfaces of the strengthening plate 4 and the supporting plate 3.

In the display module 100 provided in some embodiments of the present disclosure, the depression structure 5 is disposed in the at least one surface of the two opposite surfaces of the strengthening plate 4 and the supporting plate 3, which reduce the actual contact area between the supporting plate 3 and the strengthening plate 4 (i.e., reduce the passage for heat transmission in the Z direction), thereby effectively reducing the transmission efficiency of heat in the Z direction. In a process of transmitting the heat generated by the driving chip 2 to the display portion 11 in the Z direction, when the heat reaches the depression structure 5, the path of heat conduction is blocked, thereby further reducing the transmission efficiency of heat in the Z direction.

In summary, the display module 100 in the embodiments can effectually reduce the influence of the temperature of driving chip 2 on the flexible display panel 1, prevents the display portion 11 from being burned by the heat of the driving chip 2, thereby effectively improving the display performance of the display module 100 and extending the service life of the display module 100. In addition, the depression structure 5 also has a positive effect on solving a problem of excessive weight of the display module 100.

FIG. 3A is a schematic diagram of a display module, in accordance with some embodiments. FIG. 3B is a schematic diagram of another display module, in accordance with some embodiments. FIG. 3C is a schematic diagram of yet another display module, in accordance with some embodiments.

In some embodiments of the present disclosure, the orthographic projection, on the lead-out portion 12, of the depression structure 5 in the at least one surface at least partially overlaps with the orthographic projection of the at least one driving chip 2 on the lead-out portion 12, which includes the following several situations.

In a first situation, as shown in FIG. 3A, in a case where there is one driving chip 2, the orthographic projection, on the lead-out portion 12, of the depression structure 5 in the at least one surface at least partially overlaps with the orthographic projection of the one driving chip 2 on the lead-out portion 12. That is, at a position corresponding to the driving chip 2, the depression structure 5 is disposed in the at least one surface of the two opposite surfaces of the strengthening plate 4 and the supporting plate 3. The depression structure 5 is used to prevent the display portion 11 from being burned by the heat of the driving chip 2, thereby extending the service life of the display module 100.

In a second situation, as shown in FIG. 3B, in a case where there are two or more driving chips 2, the orthographic projection, on the lead-out portion 12, of the depression structure 5 in the at least one surface at least partially overlaps with an orthographic projection of one driving chip 2 on the lead-out portion 12. Alternatively, in a case where the number of driving chips 2 is multiple, the orthographic projection, on the lead-out portion 12, of the depression structure 5 in the at least one surface at least partially overlaps with orthographic projections of two or more driving chips 2 on the lead-out portion 12. At a position corresponding to the driving chips 2, the depression structure 5 is disposed in the at least one surface of the two opposite surfaces of the strengthening plate 4 and the supporting plate 3, thereby preventing the display portion 11 from being burned by the heat of the driving chips 2, and extending the service life of the display module 100.

In a third situation, as shown in FIG. 3C, in a case where there are two or more driving chips 2, the orthographic projection, on the lead-out portion 12, of the depression structure 5 in the at least one surface at least partially overlaps with an orthographic projection of each driving chip 2 on the lead-out portion 12. At a position corresponding to each driving chip 2, the depression structure 5 is disposed in the at least one surface of the two opposite surfaces of the strengthening plate 4 and the supporting plate 3. The depression structure 5 is better used to prevent the display portion 11 from being burned by the heat of the driving chip 2, and the service life of the display module 100 is extended.

A structure of the strengthening plate 4 in some embodiments of the present disclosure will be described below in combination with FIGS. 4 to 9.

FIG. 4 is a structural diagram of a strengthening plate, in accordance with some embodiments. In some embodiments of the present disclosure, referring to FIG. 4, the depression structure 5 includes a first depression structure 51 that is disposed in a surface of the strengthening plate 4 proximate to the supporting plate 3. The first depression structure 51 includes a plurality of first grooves 51a. The plurality of first grooves 51a extend in a first direction A1 and are arranged at intervals in a second direction A2. The first direction A1 and the second direction A2 intersect and are both parallel to the strengthening plate.

In some examples, referring to FIG. 4, the first direction A1 and the second direction A2 are perpendicular to each other. For example, the first direction A1 may be parallel to the X direction in FIGS. 2 and 4, and the second direction A2 may be parallel to the Y direction in FIGS. 2 and 4.

It can be understood that, in other examples, an included angle between the first direction A1 and the second direction A2 may also be an obtuse angle or an acute angle.

In the display module 100 in some embodiments of the present disclosure, the plurality of first grooves 51a arranged at intervals are disposed in the strengthening plate 4, and each first groove 51a forms a cavity between the supporting plate 3 and the strengthening plate 4. With such arrangement, the actual contact area between the strengthening plate 4 and the supporting plate 3 is reduced, and the conduction path of partial heat in the Z direction is blocked, thereby effectively reducing the transmission efficiency of the heat in the Z direction. In addition, the first grooves 51a are disposed in the strengthening plate 4, which also enables the weight of the strengthening plate 4 to be effectively reduced.

For example, an orthographic projection of at least one first groove 51a on the lead-out portion 12 at least partially overlaps with the orthographic projection of the driving chip 2 on the lead-out portion 12, which is conducive to reducing the transmission efficiency of the heat in the Z direction.

FIG. 5 is a structural diagram of another display module, in accordance with some embodiments. In some embodiments of the present disclosure, referring to FIG. 5, the depression structure 5 includes a first depression structure 51 that is disposed in the surface of the strengthening plate 4 proximate to the supporting plate 3. The first depression structure 51 includes a plurality of first grooves 51a. The plurality of first grooves 51a extend in the second direction A2 and are arranged at intervals in the second direction A2. The number of the first grooves 51a in the first depression structure 51 is greater than or equal to the number of the driving chips 2. The orthographic projection of each driving chip 2 on the lead-out portion 12 at least partially overlaps with an orthographic projection of at least one first groove 51a on the lead-out portion 12.

FIG. 5 illustrates an example in which the number of the first grooves 51a in the first depression structure 51 is greater than the number of the driving chips 2. For example, the first depression structure 51 includes four first grooves 51a, and the number of the driving chips 2 is two; and one driving chip 2 corresponds to two first grooves 51a. That is, the orthographic projection of each driving chip 2 on the lead-out portion 12 at least partially overlaps with orthographic projections of two first grooves 51a on the lead-out portion 12. The first grooves 51a are used to form cavities between the supporting plate 3 and the strengthening plate 4, which reduces the actual contact area between the strengthening plate 4 and the supporting plate 3, blocks the conduction path of partial heat in the Z direction, and thus effectively reduces the transmission efficiency of the heat in the Z direction. Therefore, the display portion 11 is prevented from being burned by the heat of the driving chip 2, and the service life of the display module 100 is extended.

In some examples, referring to FIG. 5, the second direction A2 may be parallel to the Y direction in FIGS. 2 and 5.

FIG. 6 is a structural diagram of yet another display module, in accordance with some embodiments. In some embodiments of the present disclosure, referring to FIG. 6, the plurality of first grooves 51a are also arranged at intervals in the first direction A1. The first direction A1 and the second direction A2 intersect and are both parallel to the strengthening plate 4.

FIG. 6 illustrates an example in which the number of the first grooves 51a in the first depression structure 51 is greater than the number of the driving chips 2. For example, the first depression structure 51 includes eight first grooves 51a, and the number of the driving chips 2 is two; and one driving chip 2 corresponds to four first grooves 51a. The four first grooves 51a are arranged in an array at positions corresponding to the one driving chip 2. The first grooves 51a are used to form cavities between the supporting plate 3 and the strengthening plate 4, which reduces the actual contact area between the strengthening plate 4 and the supporting plate 3, blocks the conduction path of partial heat in the Z direction, and thus effectively reduces the transmission efficiency of the heat in the Z direction. Therefore, the display portion 11 is prevented from being burned by the heat of the driving chip 2, and the service life of the display module 100 is extended.

In some examples, the first direction A1 and the second direction A2 are perpendicular to each other. For example, the first direction A1 may be parallel to the X direction in FIGS. 2 and 6, and the second direction A2 may be parallel to the Y direction in FIGS. 2 and 6.

It can be understood that, in other examples, an included angle between the first direction A1 and the second direction A2 may also be an obtuse angle or an acute angle.

In some embodiments, with continued reference to FIGS. 5 and 6, an orthographic projection of at least one edge of a first groove 51a on the lead-out portion 12 is located outside an orthographic projection of a driving chip 2 on the lead-out portion 12, which is more conducive to increasing the volume of the cavity formed by the first groove 51a between the supporting plate 3 and the strengthening plate 4. The actual contact area between the strengthening plate 4 and the supporting plate 3 is reduced to a greater extent, and the conduction path of partial heat in the Z direction is blocked, thereby effectively reducing the transmission efficiency of the heat in the Z direction. It can be understood that, in other embodiments, an orthographic projection of the first groove 51a on the lead-out portion 12 is within the orthographic projection of the driving chip 2 on the lead-out portion 12.

In some examples, referring to FIG. 4, the plurality of first grooves 51a do not penetrate through two opposite side surfaces (d1 and d2) of the strengthening plate 4 in the first direction A1. In the examples, the plurality of first grooves 51a do not penetrate through the two opposite side surfaces (d1 and d2) of the strengthening plate 4, so that the periphery of the strengthening plate 4 has a continuous frame region, and the frame region maintains the original thickness, which effectively improves the structural strength of the strengthening plate 4.

FIG. 7 is a structural diagram of another strengthening plate, in accordance with some embodiments. In other examples, referring to FIG. 7, at least one first groove 51a in the plurality of first grooves 51$a$ penetrates one of the two opposite side surfaces (d1 and d2) of the strengthening plate 4 in the first direction A1.

It can be understood that, FIG. 7 only illustrates that all the first grooves 51$a$ penetrate through only the side surface d1 of the strengthening plate 4 in the first direction A1, but the embodiments of the present disclosure are not limited thereto. For example, all the first grooves 51$a$ may penetrate through only the other side surface d2 of the strengthening plate 4 in the first direction A1; or a part of all the first grooves 51$a$ may penetrate through the side surface d1 of the strengthening plate 4 in the first direction A1, and another part of all the first grooves 51$a$ may penetrate through the other side surface d2 of the strengthening plate 4 in the first direction A1; or a part of the first grooves 51$a$ may penetrate through one of the two opposite side surfaces (d1 and d2) of the strengthening plate 4 in the first direction A1, and the remaining first grooves 51$a$ penetrate through neither the side surface d1 nor the other side surface d2 of the strengthening plate.

Among the plurality of first grooves 51$a$ in some of the above examples, at least one first groove 51$a$ can communicate with the outside. With such arrangement, it is beneficial for air circulation, so that the heat between strengthening plate 4 and the supporting plate 3 can be discharged with the flow of air, which is conducive to the heat dissipation and effectively avoids the heat concentration.

FIG. 8 is a structural diagram of yet another strengthening plate, in accordance with some embodiments. In still other examples, referring to FIG. 8, the plurality of first grooves 51$a$ simultaneously penetrate through the two opposite side surfaces (d1 and d2) of the strengthening plate 4 in the first direction A1. In the examples, the plurality of first grooves 51$a$ form a plurality of airflow channels in the first direction a1 in the surface of the strengthening plate 4 facing the supporting plate 3, which is conducive to air circulation between the strengthening plate 4 and the supporting plate 3, thereby enabling some of heat generated by the driving chip 2 to be quickly carried away by flowing air, and further enabling less heat to be transferred to the supporting plate 3. Thus, the heat is not easily concentrated to the position in the display portion 11 of the flexible display panel 1 corresponding to the driving chip 2.

FIG. 9 is a structural diagram of yet another strengthening plate, in accordance with some embodiments. In some embodiments of the present disclosure, referring to FIG. 9, the depression structure 5 includes a second depression structure 52 that is disposed in the strengthening plate. The second depression structure 52 includes a plurality of first holes 52$a$ arranged at intervals. The first hole 52$a$ extends in a thickness direction of the strengthening plate 4 and penetrates at least through the surface of the strengthening plate 4 proximate to the supporting plate 3. In the embodiments, the actual contact area between the strengthening plate 4 and the supporting plate 3 is reduced by arranging the plurality of first holes 52$a$ in the strengthening plate 4, so as to reduce the transmission efficiency of the heat in the Z direction, prevent the display portion 11 from being burned, and extend the service life of the display module 100. Moreover, by using the first holes 52$a$ as the second depression structure 52, the structural strength of the strengthening plate 4 can be improved.

For example, an orthographic projection of at least one first hole 52$a$ on the lead-out portion 12 at least partially overlaps with the orthographic projection of the driving chip 2 on the lead-out portion 12, which is conducive to reducing the transmission efficiency of the heat in the Z direction.

In some examples, referring to FIG. 9, the first hole 52$a$ only penetrates through the surface of the strengthening plate 4 proximate to the supporting plate 3. That is, the first hole 52$a$ is a blind hole. The first hole 52$a$ may be a circular hole (as shown in FIG. 9), or may be any other polygonal hole or irregular hole, and a shape of the first hole 52$a$ may be arbitrarily selected according to actual needs during use. In the examples, the first hole 52$a$ is the blind hole, which can effectively reduce the actual contact area between the supporting plate 3 and the strengthening plate 4, and improve the structural strength of the strengthening plate 4.

In other examples, the first hole 52$a$ further penetrates through a surface of the strengthening plate 4 away from the supporting plate 3. That is, in these examples, the first hole 52$a$ is a through hole that penetrates through the surface of the strengthening plate 4 proximate to the supporting plate 3 and the surface of the strengthening plate 4 away from the supporting plate 3. Such arrangement can not only reduce the actual contact area between the strengthening plate 4 and the supporting plate 3, but also facilitate heat dissipation.

It should be noted that, in other examples, the plurality of first holes 52$a$ may include both blind holes and through holes. With such arrangement, it can not only reduce the actual contact area between the strengthening plate 4 and the supporting plate 3, but also facilitate heat dissipation; in addition, the strength of the strengthening plate 4 is ensured.

FIG. 10 is a structural diagram of yet another strengthening plate, in accordance with some embodiments. In some embodiments of the present disclosure, referring to FIG. 10, a first depression structure 51 and a second depression structure 52 are provided in the strengthening plate 4. At least one first depression structure 51 and at least one second depression structure 52 are alternately arranged in the first direction A1 or in the second direction A2.

FIG. 10 illustrates an example in which the first depression structures 51 and the second depression structures 52 are alternately arranged in the second direction A2. It can be understood that, in other embodiments, at least one first depression structure 51 and at least one second depression structure 52 may be alternately arranged in the first direction A1.

In some examples, referring to FIG. 10, the first direction A1 and the second direction A2 are perpendicular to each other. For example, the first direction A1 may be parallel to the X direction in FIGS. 2 and 10, and the second direction A2 may be parallel to the Y direction in FIGS. 2 and 10.

It can be understood that, in other examples, an included angle between the first direction A1 and the second direction A2 may also be an obtuse angle or an acute angle.

For the strengthening plate 4 in some of the above embodiments, referring to FIGS. 4, 7 and 8, the strengthening plate 4 may only include the first depression structure 51. That is, only the plurality of first grooves 51$a$ are disposed in the strengthening plate 4. Referring to FIG. 9, the strengthening plate 4 may only include the second depression structure 52. That is, only the plurality of first holes 52$a$ are disposed in the strengthening plate 4. Or both the first depression structure 51 and the second depression structure 52 may be included. That is, the plurality of first grooves 51$a$ and the plurality of first holes 52$a$ are disposed in the strengthening plate 4. Referring to FIG. 10, in the strengthening plate 4, first holes 52$a$ are disposed between two adjacent first grooves 51$a$.

The structure of the strengthening plate 4 in some embodiments of the present disclosure is described above in combination with FIGS. 4 to 10. A structure of the supporting plate 3 in some embodiments of the present disclosure will be described below in combination with FIGS. 11 to 17. In FIGS. 11 to 15, the dashed box 4A indicates a position of a projection of the strengthening plate 4 on the supporting plate 3 in a case where the strengthening plate 4 is combined with the supporting plate 3.

In some embodiments of the present disclosure, referring to FIG. 11 (FIG. 11 is a structural diagram of a supporting plate 3, in accordance with some embodiments), the depression structure 5 includes a third depression structure 53 that is disposed in a surface of the supporting plate 3 proximate to the strengthening plate 4. The third depression structure 53 includes a plurality of second grooves 53a. The plurality of second grooves 53a extend in a third direction B1 and are arranged at intervals in a fourth direction B2. The third direction B1 and the fourth direction B2 intersect and are both parallel to the supporting plate.

In some examples, as shown in FIG. 11, the third direction B1 is perpendicular to the fourth direction B2. For example, the third direction B1 may be parallel to the Y direction in FIGS. 2 and 11, and the fourth direction B2 may be parallel to the X direction in FIGS. 2 and 11.

It can be understood that, in other examples, an included angle between the third direction B1 and the fourth direction B2 may be an obtuse angle or an acute angle.

In the display module 100 in some embodiments of the present disclosure, the plurality of second grooves 53a arranged at intervals are disposed in the supporting plate 3, and each second groove 53a forms a cavity between the supporting plate 3 and the strengthening plate 4. In this way, the actual contact area between the supporting plate 3 and the strengthening plate 4 is reduced, thereby reducing the conduction path of the heat in the Z direction, and effectively reduce the transmission efficiency of the heat in the Z direction. In addition, the second grooves 53a are disposed in the supporting plate 3, which can effectively reduce the weight of the supporting plate 3.

For example, an orthographic projection of at least one second groove 53a on the lead-out portion 12 at least partially overlaps with the orthographic projection of the driving chip 2 on the lead-out portion 12, which is conducive to reducing the transmission efficiency of the heat in the Z direction.

In some examples, referring to FIG. 11, the plurality of second grooves 53a do not penetrate through two opposite side surfaces f1 and f2 of the supporting plate 3 in the third direction B1 and do not exceed of two opposite edges of the strengthening plate 4 in the third direction B1 (that is, the plurality of second grooves 53a do not exceed two edges (e1 and e2) of the dashed box 4A in FIG. 11. With such arrangement, a frame region of a periphery of the supporting plate 3 maintains the original thickness, which can effectively improve the structural strength of the supporting plate 3.

FIG. 12 is a structural diagram of another supporting plate, in accordance with some embodiments. In other examples, referring to FIG. 12, at least one end of at least one second groove 53a in the plurality of second grooves 53a in the third direction B1 exceeds edge(s) of the strengthening plate 4. That is, the at least one end of the at least one second groove 53a exceeds at least one edge in the two opposite edges (e1 and e2) of the dashed box 4A in FIG. 12.

It can be understood that FIG. 12 only illustrates that all the second grooves 53a exceed one edge of the strengthening panel 4 (i.e., exceed the edge e2 of the dashed box 4A in FIG. 12) in the third direction B1. The embodiments of the present disclosure are not limited thereto.

For example, all the second grooves 53a may exceed the other edge of the strengthening plate 4 (i.e., exceed the edge e1 of the dashed box 4A in FIG. 12) in the third direction B1.

Alternatively, a part of all the second grooves 53a may exceed one edge of the strengthening plate 4 (i.e., exceed the edge e2 of the dashed box 4A) in the third direction B1, and another part of all the second grooves 53a may exceed the other edge of the strengthening plate 4 (i.e., exceed the edge e1 of the dashed box 4A) in the third direction B1.

Alternatively, a part of all the second grooves 53a may exceed one of the two opposite edges of the strengthening plate 4 (i.e., exceed the edge e2 or e1 of the dashed box 4A) in the third direction B1, and another part of all the second grooves 53a may exceed neither the edge e1 of the dashed box 4A nor the edge e2 of the dashed box 4A.

In addition, as shown in FIG. 13, all the second grooves 53a may exceed the two opposite edges of the strengthening plate 4 (i.e., exceed the two opposite edges e1 and e2 of the dashed box 4A in FIG. 13) in the third direction B1.

In this example, the at least one end of the at least one second groove 53a in the third direction B1 exceeds the edge of the strengthening plate 4 (that is, the at least one second groove 53a can communicate with the outside), which is conducive to air circulation and accelerating heat dissipation, so as to effectively avoid heat concentration.

FIG. 14 is a structural diagram of yet another supporting plate, in accordance with some embodiments. In still other examples, referring to FIG. 14, at least one end of at least one second groove 53a in the plurality of second grooves 53a in the third direction B1 penetrates through at least one side surface of the two opposite side surfaces f1 and f2 of the supporting plate 3.

It can be understood that FIG. 14 only illustrates that all the second grooves 53a penetrate through one side surface f2 of the supporting plate 3 in the third direction B1. The embodiments of the present disclosure are not limited thereto. For example, referring to FIG. 15, at least one second groove 53a in the plurality of second grooves 53a penetrates through one side surface f2 of the supporting plate 3 in the third direction B1. The remaining second grooves 53a penetrate through the other side surface f1 of the supporting plate 3 in the third direction B1. For example, referring to FIG. 16, all the second grooves 53a may penetrate through the two opposite side surfaces f1 and f2 of the supporting plate 3 in the third direction B1.

In the examples, the at least one end of the at least one second groove 53a in the third direction B1 penetrates through the at least one side surface of the two opposite side surfaces of the supporting plate 3. With such arrangement, the actual contact area between the supporting plate 3 and the strengthening plate 4 can be reduced, and the transmission efficiency of the heat in the Z direction can be reduced. In addition, at least one airflow channel in the third direction B1 is formed, which facilitates the air circulation between the strengthening plate 4 and the supporting plate 3. Furthermore, the weight of the supporting plate is further reduced.

In some embodiments, in the case where the supporting plate 3 in the display module 100 includes the third depression structure 53, the strengthening plate 4 may include the first depression structure 51 and/or the second depression structure 52. That is, in the display module 100, the depression structure of the supporting plate 3 and the depression structure(s) of the strengthening plate 4 may be mutually matched, and the specific matching manner, arrangement manner and number of the depression structures are not limited.

In some examples, the supporting plate 3 of the display module 100 may only include the third depression structure 53; and no depression structure is disposed in the strengthening plate 4. In some examples, the supporting plate 3 of the display module 100 may include the third depression structure 53; and the strengthening plate 4 includes the first depression structure 51. In some examples, the supporting plate 3 of the display module 100 may include the third depression structure 53; and the strengthening plate 4 includes the second depression structure 52. In some examples, the supporting plate 3 of the display module 100 may include the first depression structure 51; and the strengthening plate 4 includes the second depression structure and the third depression structure.

In some examples, an orthographic projection of the depression structure of the supporting plate 3 on the lead-out portion 12 at least partially overlaps with an orthographic projection of the strengthening plate 4 on the lead-out portion 12. For example, the orthographic projection of the third depression structure 53 on the lead-out portion 12 at least partially overlaps with the orthographic projection of the first depression structure 51 on the lead-out portion 12. That is, the first depression structure 51 and the third depression structure 53 form a cavity. Alternatively, the orthographic projection of the third depression structure 53 on the lead-out portion 12 at least partially overlaps with the orthographic projection of the second depression structure 52 on the lead-out portion 12. That is, the second depression structure 52 and the third depression structure 53 form a cavity. In this example, the orthographic projection of the depression structure of the supporting plate 3 on the lead-out portion 12 at least partially overlaps with the orthographic projection of the strengthening plate 4 on the lead-out portion 12, which may further increase the volume of the cavity formed by the depression structure 5, and is conducive to further reducing the transmission efficiency of the heat in the Z direction.

In some embodiments of the present disclosure, referring to FIG. 17 (FIG. 17 is a structural diagram of yet another supporting plate, in accordance with some embodiment), the depression structure 5 includes a fourth depression structure 54 that is disposed in the supporting plate 3. The fourth depression structure 54 includes a plurality of second holes 54a arranged at intervals, and the second hole 54a extends in a thickness direction of the supporting plate 3 and penetrates at least through the surface of the supporting plate 3 proximate to the strengthening plate 4. In the embodiments, since the plurality of second holes 54a are disposed in the supporting plate 3, the actual contact area between the supporting plate 3 and the strengthening plate 4 can be reduced, so as to reduce the transmission efficiency of the heat in the Z direction, and thus prevent the display portion from being burned and extend the service life of the display module. In addition, by using the second holes 54a as the fourth depression structure 54, the structural strength of the supporting plate 3 can be improved.

For example, an orthographic projection of at least one second hole 54a on the lead-out portion 12 at least partially overlaps with the orthographic projection of the driving chip 2 on the lead-out portion 12, which is conducive to reducing the transmission efficiency of the heat in the Z direction.

In some examples, referring to FIG. 17, the second hole 54a only penetrates through the surface of the supporting plate 3 proximate to the strengthening plate 4. That is, the second hole 54a is a blind hole. A shape of the second hole 54a may be circular (as shown in FIG. 17), polygonal or irregular, and it may be arbitrarily selected according to actual needs during use. The second hole 54a is the blind hole, which can effectively reduce the actual contact area between the supporting plate 3 and the strengthening plate 4, and improve the structural strength of the supporting plate 3.

In other examples, the second hole 54a further penetrates through a surface of supporting plate 3 away from strengthening plate 4. That is, the second hole 54a is a through hole that penetrates through the surface of the supporting plate 3 proximate to the strengthening plate 4 and the surface of the supporting plate 3 away from the strengthening plate 4. In the examples, since the second hole 54a is the through hole, the surface of the strengthening plate 4 opposite to the supporting plate 3 can be communicated with the outside air, so that the strengthening plate 4 can directly dissipate heat through the plurality of second holes 54a, and the heat dissipation effect is improved.

It should be noted that, referring to FIG. 17, in other examples, the plurality of second holes 54a may include both blind holes and through holes. With such arrangement, it can not only reduce the actual contact area between the strengthening plate 4 and the supporting plate 3, but also facilitate heat dissipation; in addition, the strength of the supporting plate 3 is ensured.

In some of the above embodiments, the supporting plate 3 may include only the third depression structure 53. That is, only the plurality of second grooves 53a are disposed in the supporting plate 3. Alternatively, the supporting plate 3 may include only the fourth depression structure 54. That is, only the plurality of second holes 54a are disposed in the supporting plate 3. Alternatively, both the third depression structure 53 and the fourth depression structure 54 may be included. That is, both the plurality of second grooves 53a and the plurality of second holes 54a are disposed in the supporting plate 3. For example, second holes 54a are disposed between two adjacent second grooves 53a.

In some embodiments, in the case where the supporting plate 3 in the display module 100 includes the third depression structure 53 and/or the fourth depression structure 54, the strengthening plate 4 may include the first depression structure 51 and/or the second depression structure 52. That is, in the display module 100, the depression structure(s) of the supporting plate 3 and the depression structure(s) of the strengthening plate 4 may be mutually matched, and the specific matching manner, arrangement manner and number of the depression structures are not limited.

In some examples, the supporting plate 3 includes the third depression structure 53 and the fourth depression structure 54, and no depression structure is disposed in the strengthening plate 4. In some examples, the supporting plate 3 of the display module 100 includes the third depression structure 53 and the fourth depression structure 54. The strengthening plate 4 includes the first depression structure 51. In some examples, the supporting plate 3 of the display module 100 includes the third depression structure 53 and the fourth depression structure 54. The strengthening plate 4 includes the second depression structure 52. In some examples, the supporting plate 3 of the display module 100 includes the third depression structure 53 and the fourth depression structure 54. The strengthening plate 4 includes the first depression structure 51 and the second depression structure 52.

In some examples, the orthographic projection of the depression structure of the supporting plate 3 on the lead-out portion 12 at least partially overlaps with the orthographic projection of the strengthening plate 4 on the lead-out portion 12. The first depression structure 51 and the second depression structure 52 in the strengthening plate 4, and the third depression structure 53 and the fourth depression structure 54 in the supporting plate 3 may be mutually matched and overlapped to form cavities. In the examples, the volume of the cavities formed by the depression structure 5 may be further increased, which is conducive to further reducing the transmission efficiency of the heat in the Z direction.

The structure of the supporting plate 3 in some embodiments of the present disclosure is described above in combination with FIGS. 11 to 17. A structure of a combination of the supporting plate 3 and strengthening plate 4 in some embodiments of the present disclosure will be described below in combination with FIGS. 18 to 23.

In some embodiments of the present disclosure, referring to FIG. 18 (FIG. 18 is a top view of a combination of the supporting plate and strengthening plate, in accordance with some embodiments), the plurality of first grooves 51a are disposed in the strengthening plate 4. The plurality of first grooves 51a extend in the first direction A1 and are arranged at intervals in the second direction A2. The first direction A1 and the second direction A2 intersect and are both parallel to the strengthening plate 4. The plurality of second grooves 53a are disposed in the supporting plate 3. The plurality of second grooves 53a extend in the third direction B1 and are arranged at intervals in the fourth direction B2. The third direction B1 and the fourth direction B2 intersect and are both parallel to the supporting plate 3. The first direction A1 and the third direction B1 intersect with each other.

In some examples, referring to FIG. 18, the first direction A1 and the third direction B1 are perpendicular to each other.

For example, the first direction A1 is parallel to an extending direction of a bending axis of the bending portion 13 (i.e., the Y direction in FIG. 2), and the third direction B1 is perpendicular to the extending direction of the bending axis (i.e., the Y direction in FIG. 2).

It can be understood that, in other examples, an included angle between the first direction A1 and the third direction B1 may also be an obtuse angle or an acute angle.

In the display module 100 in some embodiments of the present disclosure, the plurality of first grooves 51a are disposed in the strengthening plate 4, and the plurality of second grooves 53a are disposed in the supporting plate 3. With such arrangement, on one hand, the actual contact area between the supporting plate 3 and the strengthening plate 4 can be reduced to the greatest extent, and the transmission efficiency of the heat in the Z direction can be reduced. On another hand, since the plurality of first grooves 51a and the plurality of second grooves 53a are intersected and in a grid shape, air absorbing heat between the strengthening plate 4 and the supporting plate 3 can be uniformly distributed in the grid formed by the plurality of first grooves 51a and the plurality of second grooves 53a, and heat concentration is avoided. On yet another hand, since the extending directions of the plurality of first grooves 51a and the plurality of second grooves 53a are different and are intersected with each other, the strengthening plate 4 and the supporting plate 3 can be used in cooperation and can be mutually supported, and the structural strength and the bending resistance of the display module 100 can be improved.

In some examples, orthogonal projection(s) of the first groove 51a and/or the second groove 53a on the lead-out portion 12 at least partially overlaps with the orthogonal projection of the driving chip 2 on the lead-out portion 12.

For example, an orthographic projection of the intersection between the first groove 51a and the second groove 53a on the lead-out portion 12 at least partially overlaps with the orthographic projection of the driving chip 2 on the lead-out portion 12. With such arrangement, it can reduce the transmission efficiency of the heat in the Z direction, and facilitate the heat dissipation.

In some examples, referring to FIG. 18, two ends of each of the plurality of first grooves 51a do not penetrate through the two opposite side surfaces d1 and d2 of the strengthening plate 4 in the first direction A1. Two ends of each of the plurality of second grooves 53a do not exceed the two opposite side surfaces g1 and g2 of the strengthening plate 4 in the third direction B1.

It can be understood that, in other examples, at least one first groove 51a in the plurality of first grooves 51a may penetrate through at least one side surface of the two opposite side surfaces d1 and d2 of the strengthening plate 4 in the first direction A1. The two ends of each of the plurality of second grooves 53a do not exceed the two opposite side surfaces g1 and g2 of the strengthening plate 4. Alternatively, at least one second groove 53a in the plurality of second grooves 53a may exceed at least one side surface of the two opposite side surfaces (g1 and g2) of the strengthening plate 4 in the third direction B1. The two ends of each of the plurality of first grooves 51a do not penetrate through the two opposite side surfaces d1 and d2 of the strengthening plate 4 in the first direction A1. This example is not limited thereto.

FIG. 19 is a top view of another combination of the supporting plate and the strengthening plate, in accordance with some embodiments. In other examples, referring to FIG. 19, at least one first groove 51a in the plurality of first grooves 51a penetrates through at least one side surface of the two opposite side surfaces (d1 and d2) of the strengthening plate 4 in the first direction A1. Alternatively, at least one second groove 53a in the plurality of second grooves 53a exceeds at least one side surface of the two opposite side surfaces (g1 and g2) of the strengthening plate 4 in the third direction B1.

It can be understood that, FIG. 19 only illustrates that all the first grooves 51a penetrate through the two opposite side surfaces d1 and d2 of the strengthening plate 4 in the first direction A1, and all the second grooves 53a exceed the two opposite side surfaces g1 and g2 of the strengthening plate 4 in the third direction B1. However, the embodiments of the present disclosure are not limited thereto.

For example, a part of all the first grooves 51a may penetrate through the two opposite side surfaces d1 and d2 of the strengthening plate 4 in the first direction A1, and two ends of each of the other part of all the first grooves 51a may not penetrate through the two opposite side surfaces d1 and d2 of the strengthening plate 4. A part of all the second grooves 53a may exceed the two opposite side surfaces g1 and g2 of the strengthening plate 4 in the third direction B1, and two ends of each of the other part of all the second grooves 53a may not exceed the two opposite side surfaces g1 and g2 of the strengthening plate 4.

For example, a part of all the first grooves 51a may penetrate through one side surface d1 of the strengthening plate 4 in the first direction A1, and the other part of all the first grooves 51a may penetrate through the other side surface d2 of the strengthening plate 4 in the first direction A1. A part of all the second grooves 53a may exceed one side surface g1 of the strengthening plate 4 in the third direction B1, and the other part of all the second grooves 53a may exceed the other side surface g2 of the strengthening plate 4 in the third direction B1.

In the examples, the plurality of first grooves 51a and the plurality of second grooves 53a intersect with each other, and at least one of the first grooves 51*a* or the second grooves 53*a* is in communication with the outside air. That is, fluid passage formed by the plurality of first grooves 51*a* and the plurality of second grooves 53*a* can be in communication with the outside air. Thus, the air carrying heat between the strengthening plate 4 and the supporting plate 3 can circulate to the outside, which is beneficial to heat dissipation and avoids heat concentration.

FIG. 22 is a top view of yet another combination of the supporting plate and the strengthening plate, in accordance with some embodiments. In still other examples, referring to FIG. 22, at least one first groove 51*a* in the plurality of first grooves 51*a* penetrates through at least one side surface of the two opposite side surfaces (d1 and d2) of the strengthening plate 4 in the first direction A1. At least one end of at least one second groove 53*a* in the plurality of second grooves 53*a* in the third direction B1 penetrates through at least one side surface of the two opposite side surfaces (f1 and f2) of the supporting plate 3.

It can be understood that, FIG. 22 only illustrates that all the first grooves 51*a* penetrate through the two opposite side surfaces (d1 and d2) of the strengthening plate 4 in the first direction A1; and all the second grooves 53*a* penetrate through the two opposite side surfaces (f1 and f2) of the supporting plate 3 in the third direction B1. However, the embodiments of the present disclosure are not limited thereto.

For example, a part of all the first grooves 51*a* may penetrate through one side surface d1 of the strengthening plate 4 in the first direction A1, and the other part of all the first grooves 51*a* may penetrate through the other side surface d2 of the strengthening plate 4 in the first direction A1. A part of all the second grooves 53*a* may penetrate through one side surface f1 of the supporting plate 3 in the third direction B1, and the other part of all the second grooves 53*a* may penetrate through the other side surface f2 of the supporting plate 3 in the third direction B1.

In some embodiments of the present disclosure, sectional shapes of the first groove 51*a* and the second groove 53*a* may be selected from rectangular shapes (as shown in FIGS. 20 and 21, where FIG. 20 is a right side view of the combination of the supporting plate and the strengthening plate in FIG. 19, and FIG. 21 is a front view of the combination of the supporting plate and the strengthening plate in FIG. 19), trapezoidal shapes, inverted trapezoidal shapes, or the like, and the sectional shapes of the first groove 51*a* and the second groove 53*a* may be the same or different. If the sectional shapes of the first groove 51*a* and the second groove 53*a* are rectangular or trapezoidal, there is an advantage that etching processing is facilitated. If the sectional shapes of the first groove 51*a* and the second groove 53*a* are inverted trapezoidal, the actual contact area between the supporting plate 3 and the strengthening plate 4 can be effectively reduced due to large openings of the inverted trapezoids, so that the transmission efficiency of the heat in the Z direction can be reduced.

FIG. 23 is a top view of yet another combination of the supporting plate and the strengthening plate, in accordance with some embodiments.

In some embodiments of the present disclosure, referring to FIG. 23, the plurality of first holes 52*a* are disposed in the strengthening plate 4. The plurality of first holes 52*a* penetrate at least through the surface of the strengthening plate 4 proximate to the supporting plate 3. The plurality of first holes 52*a* are arranged in a plurality of rows and are arranged in a plurality of columns. The plurality of second holes 54*a* are disposed in the supporting plate 3. The plurality of second holes 54*a* penetrate at least through the surface of the supporting plate 3 proximate to the strengthening plate 4. The plurality of second holes 54*a* are arranged in a plurality of rows and are arranged in a plurality of columns. In a column direction, a row of first holes 52*a* is arranged alternately with a row of second holes 54*a*, and first holes 52*a* in a row and second holes 54*a* in an adjacent row are staggered.

For example, an orthographic projection of at least one first hole 52*a* and/or at least one second hole 54*a* on the lead-out portion 12 at least partially overlaps with the orthographic projection of the driving chip 2 on the lead-out portion 12.

In some examples, referring to FIG. 23, the first hole 52*a* and the second hole 54*a* are both blind holes. The first hole 52*a* penetrates through the surface of the strengthening plate 4 proximate to the supporting plate 3. The second hole 54*a* penetrates through the surface of the supporting plate 3 proximate to the strengthening plate 4.

In other examples, the first hole 52*a* and the second hole 54*a* are both through holes. Two ends of the first hole 52*a* penetrate through the surface of the strengthening plate 4 proximate to the supporting plate 3 and the surface of the strengthening plate 4 away from the supporting plate 3, respectively. Two ends of the second hole 54*a* penetrate through the surface of the supporting plate 3 proximate to the strengthening plate 4 and the surface of the supporting plate 3 away from the strengthening plate 4, respectively.

In still other examples, the plurality of first holes 52*a* may include both blind holes and through holes. The plurality of second holes 54*a* may include both blind holes and through holes.

In the embodiments, the first holes 52*a* and the second holes 54*a* are arranged to reduce the actual contact area between the supporting plate 3 and the strengthening plate 4, which can not only reduce the transmission efficiency of the heat in the Z direction, but also facilitate the improving of the structural strength of the supporting plate 3 and the strengthening plate 4.

It should be noted that, in the structure of the combination of the strengthening plate 4 and the supporting plate 3 in some of the above embodiments, the strengthening plate 4 may include only the first depression structure 51, or may include only the second depression structure 52. Alternatively, the strengthening plate 4 includes both the first depression structure 51 and the second depression structure 52. That is, both the plurality of first grooves 51*a* and the plurality of first holes 52*a* are disposed in the supporting plate 4. For example, first holes 52*a* are disposed between two adjacent first grooves 51*a*. The supporting plate 3 may include only the third depression structure 53, or may include only the fourth depression structure 54. Alternatively, the supporting plate 3 includes both the third depression structure 53 and the fourth depression structure 54. That is, both the plurality of second grooves 53*a* and the plurality of second holes 54*a* are disposed in the supporting plate 3. For example, second holes 54*a* are disposed between two adjacent second grooves 53*a*.

In some embodiments of the present disclosure, referring to FIG. 2, an area of an overlapping region between the orthographic projection of the strengthening plate 4 on the display portion 11 and the orthographic projection of the supporting plate 3 on the display portion 11 is greater than or equal to ¼ of an area of the orthographic projection of the supporting plate 3 on the display portion.

For example, the area of the overlapping region between the orthographic projection of the strengthening plate 4 on the display portion 11 and the orthographic projection of the supporting plate 3 on the display portion 11 is substantially equal to ¼, ⅓, ½ or ¾ of the area of the orthographic projection of the supporting plate 3 on the display portion 11.

In the embodiments, by increasing the area of the overlapping region between the orthographic projection of the strengthening plate 4 on the display portion 11 and the orthographic projection of the supporting plate 3 on the display portion 11, the heat generated by the driving chip 2 can be more evenly distributed to the supporting plate 3 through the strengthening plate 4, the heat concentration is avoided, the heat dissipation efficiency is improved, and the influence of the heat generation of the driving chip 2 on the service life of the flexible display panel 1 is reduced.

It should be noted that, in other examples, the size of the area of the overlapping region between the orthographic projection of the strengthening plate 4 on the display portion 11 and the orthographic projection of the supporting plate 3 on the display portion 11 may not be limited, and the area of the overlapping region may be as large as possible within the space allowed by the entire device.

In some embodiments of the present disclosure, as shown in FIG. 2, the display module 100 further includes a first adhesive layer 91. The first adhesive layer 91 is located between the supporting plate 3 and the strengthening plate 4. The first adhesive layer 91 includes a hollowed-out region 91*a*. The orthographic projection of the driving chip 2 on the first adhesive layer 91 is located within the hollowed-out region 91*a*.

For example, the first adhesive layer 91 is a double-sided adhesive tape.

In some examples, referring to FIG. 2, the strengthening plate 4 includes the plurality of first grooves 51*a*, the supporting plate 3 includes the plurality of second grooves 53*a*, and at least a portion of orthographic projections of the plurality of first grooves 51*a* and the plurality of second grooves 53*a* on the first adhesive layer 91 is located within the hollowed-out region 91*a*.

In some other examples, the strengthening plate 4 includes the plurality of first holes 52*a*, the supporting plate 3 includes the plurality of second holes 54*a*, and at least a portion of orthographic projections of the plurality of first holes 52*a* and the plurality of second holes 54*a* on the first adhesive layer 91 is located within the hollowed-out region 91*a*.

In some embodiments of the present disclosure, the supporting plate 3 and the strengthening plate 4 of the display module 100 are connected by the first adhesive layer 91, and in order to prevent the first adhesive layer 91 from filling the depression structure 5 between the supporting plate 3 and the strengthening plate 4 to form a bridge for heat transfer, hollowed-out region 91*a* is disposed in the first adhesive layer 91. With such arrangement, it may be possible to make the supporting plate 3 and strengthening plate 4 tightly connected together without increasing the actual contact area between the strengthening plate 4 and the supporting plate 3, which is more conducive to reducing the transmission efficiency of the heat in the Z direction.

In some embodiments of the present disclosure, referring to FIG. 2, the display module 100 further includes a second adhesive layer 92 and a third adhesive layer 93. The second adhesive layer 92 is located between the supporting plate 3 and the display portion 11. The third adhesive layer 93 is located between the strengthening plate 4 and the lead-out portion 12 of the flexible display panel 1.

For example, the second adhesive layer 92 and the third adhesive layer 93 are both double-sided adhesive tapes.

In some embodiments of the present disclosure, the supporting plate 3 of the display module 100 is connected to the display portion 11 through the second adhesive layer 92, and the strengthening plate 4 is connected to the lead-out portion 12 through the third adhesive layer 93, which improves the structural stability of the display module 100.

In some embodiments of the present disclosure, referring to FIG. 2, the display module 100 further includes a flexible circuit board 6 and a fourth adhesive layer 94. The flexible circuit board 6 is located on a side of the strengthening plate 4 away from the display portion 11, and the flexible circuit board 6 is bonded to an edge of the lead-out portion 12 away from the bending portion 13. The fourth adhesive layer 94 is located between the flexible circuit board 6 and the strengthening plate 4.

For example, the fourth adhesive layer 94 is a double-sided adhesive tape.

In some embodiments of the present disclosure, the flexible circuit board 6 of the display module 100 is fixed on the strengthening plate 4 through the fourth adhesive layer 94, so that the structure of the display module 100 is more compact.

In some embodiments of the present disclosure, referring to FIG. 2, the display module 100 further includes a polarizer 7, a cover plate 8, and a fifth adhesive layer 95. The polarizer 7 is disposed on the display surface c2 of the display portion 11 of the flexible display panel 1. The cover plate 8 is located on a side of the polarizer 7 away from the display portion 11. The fifth adhesive layer 95 is located between the polarizer 7 and the cover plate 8.

For example, the fifth adhesive layer 95 is an optically clear adhesive (OCA).

In some embodiments of the present disclosure, the polarizer 7 disposed on the display surface c2 of the display portion 11 of the display module 100 can reduce reflected light, thereby improving the clarity of the display module 100. The arrangement of the cover plate 8 can protect other devices such as the flexible display panel 1 from scratches, prevent other impurities such as water vapor from entering the inside of the display module 100, and extend the service life of the display module 100.

In summary, some embodiments of the present disclosure provide the display module 100 and the display device 200. The display device 200 includes the display module 100, and the display module 100 includes the flexible display panel 1, the driving chip 2, the supporting plate 3 and the strengthening plate 4. By arranging the depression structure 5 in the at least one surface of the two opposite surfaces of the strengthening plate 4 and the supporting plate 3, the actual contact area between supporting plate 3 and the strengthening plate 4 is reduced, thereby effectively reducing the transmission efficiency of the heat of the driving chip 2 in the Z direction, preventing the display portion 11 from being burned by the heat of the driving chip 2, and thus effectively improving the display performance of the display module 100 and extending the service life of the display module 100. In addition, the arrangement of the depression structure 5 also has a positive effect on solving a problem of excessive weight of the display module 100. On this basis, since the display device 200 includes the display module 100 in any of the embodiments, the display device 200 has all the advantages as described above.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A display module, comprising:
a display panel including a display portion, a bending portion and a lead-out portion, wherein the bending portion is connected to the display portion and the lead-out portion; the display portion has a display surface and a non-display surface, and the non-display surface is a surface opposite to the display surface; the lead-out portion is located at the non-display surface of the display portion;
at least one driving chip mounted on a side of the lead-out portion away from the display portion;
a supporting plate located on the non-display surface of the display portion; and
a strengthening plate located between the supporting plate and the lead-out portion;
wherein a depression structure is provided in at least one surface of two opposite surfaces of the strengthening plate and the supporting plate; the depression structure in the at least one surface forms cavities in at least one of the supporting plate and the strengthening plate; an orthographic projection, on the lead-out portion, of the depression structure in the at least one surface at least partially overlaps with an orthographic projection of the at least one driving chip on the lead-out portion.

2. The display module according to claim 1, wherein the at least one driving chip includes two or more driving chips; the orthographic projection, on the lead-out portion, of the depression structure in the at least one surface at least partially overlaps with an orthographic projection of each driving chip on the lead-out portion.

3. The display module according to claim 1, wherein the depression structure includes a first depression structure that is disposed in a surface of the strengthening plate proximate to the supporting plate; the first depression structure includes a plurality of first grooves, and the plurality of first grooves extend in a first direction and are arranged at intervals in a second direction; the first direction and the second direction intersect and are both parallel to the strengthening plate; or
the depression structure includes the first depression structure that is disposed in the surface of the strengthening plate proximate to the supporting plate; the first depression structure includes the plurality of first grooves, and the plurality of first grooves extend in the first direction and are arranged at intervals in the second direction; the first direction and the second direction intersect and are both parallel to the strengthening plate; and at least one of the plurality of first grooves penetrates through at least one side surface of two opposite side surfaces of the strengthening plate in the first direction.

4. The display module according to claim 1, wherein the depression structure includes a first depression structure that is disposed in a surface of the strengthening plate proximate to the supporting plate; the first depression structure includes a plurality of first grooves, and the plurality of first grooves extend in a second direction and are arranged at intervals in the second direction; and
a number of the plurality of first grooves in the first depression structure is greater than or equal to a number of the at least one driving chip; an orthographic projection of each driving chip on the lead-out portion at least partially overlaps with an orthographic projection of at least one first groove in the plurality of first grooves on the lead-out portion.

5. The display module according to claim 4, wherein the plurality of first grooves are also arranged at intervals in a first direction; the first direction and the second direction intersect and are both parallel to the strengthening plate; or
at least one of the plurality of first grooves penetrates through at least one side surface of two opposite side surfaces of the strengthening plate in the first direction.

6. The display module according to claim 1, wherein
the depression structure includes a second depression structure that is disposed in the strengthening plate, and the second depression structure includes a plurality of first holes arranged at intervals; a first hole in the plurality of first holes extends in a thickness direction of the strengthening plate and penetrates at least through a surface of the strengthening plate proximate to the supporting plate.

7. The display module according to claim 6, wherein
the first hole further penetrates through a surface of the strengthening plate away from the supporting plate.

8. The display module according to claim 1, wherein
the depression structure includes a third depression structure that is disposed in a surface of the supporting plate proximate to the strengthening plate, and the third depression structure includes a plurality of second grooves; the plurality of second grooves extend in a third direction and are arranged at intervals in a fourth direction; the third direction and the fourth direction intersect and are both parallel to the supporting plate.

9. The display module according to claim 8, wherein
at least one end of at least one of the plurality of second grooves in the third direction exceeds an edge of the strengthening plate.

10. The display module according to claim 8, wherein
at least one of the plurality of second grooves penetrates through at least one side surface of two opposite side surfaces of the supporting plate in the third direction.

11. The display module according to claim 8, wherein
the depression structure further includes a first depression structure that is disposed in a surface of the strengthening plate proximate to the supporting plate, and the first depression structure includes a plurality of first grooves; and
an extending direction of the plurality of second grooves intersects an extending direction of the plurality of first grooves.

12. The display module according to claim 11, wherein
the plurality of second grooves extend in a direction parallel to a bending axis of the bending portion, and the plurality of first grooves extend in a direction perpendicular to the bending axis.

13. The display module according to claim 1, wherein
the depression structure includes a fourth depression structure that is disposed in the supporting plate, and the fourth depression structure includes a plurality of second holes arranged at intervals; a second hole in the plurality of second holes extends in a thickness direction of the supporting plate and penetrates at least through a surface of the supporting plate proximate to the strengthening plate.

14. The display module according to claim 13, wherein
the second hole further penetrates through a surface of supporting plate away from strengthening plate.

15. The display module according to claim 13, wherein the depression structure further includes a second depression structure that is disposed in a surface of the strengthening plate proximate to the supporting plate, and the second depression structure includes a plurality of first holes; a first hole in the plurality of first holes extends in a thickness direction of the strengthening plate and penetrates at least through the surface of the strengthening plate proximate to the supporting plate; and the plurality of second holes are arranged in a plurality of rows, and the plurality of first holes are arranged in a plurality of rows; in a column direction, a row of first holes is arranged alternately with a row of second holes, and first holes in a row and second holes in an adjacent row are staggered.

16. The display module according to claim 1, wherein an area of an overlapping region between an orthographic projection of the strengthening plate on the display portion and an orthographic projection of the supporting plate on the display portion is greater than or equal to ¼ of an area of the orthographic projection of the supporting plate on the display portion.

17. The display module according to claim 1, further comprising:

a first adhesive layer located between the supporting plate and the strengthening plate, wherein the first adhesive layer includes a hollowed-out region, and the orthographic projection of the at least one driving chip on the first adhesive layer is located at the hollowed-out region; or a second adhesive layer located between the supporting plate and the display portion; and a third adhesive layer located between the strengthening plate and the lead-out portion of the display panel.

18. The display module according to claim 1, further comprising:

a flexible circuit board located on a side of the strengthening plate away from the display portion, wherein the flexible circuit board is bonded to an edge of the lead-out portion away from the bending portion; and a fourth adhesive layer located between the flexible circuit board and the strengthening plate.

19. The display module according to claim 1, further comprising:

a polarizer disposed on the display surface of the display portion of the display panel;

a cover plate located on a side of the polarizer away from the display portion; and a fifth adhesive layer located between the polarizer and the cover plate.

20. A display device, comprising:

the display module according to claim 1.

\* \* \* \* \*